United States Patent
Kumar et al.

(10) Patent No.: US 6,215,907 B1
(45) Date of Patent: Apr. 10, 2001

(54) RECURSIVE ON-LINE WAVELET DATA COMPRESSION TECHNIQUE FOR USE IN DATA STORAGE AND COMMUNICATIONS

(75) Inventors: Shailesh Kumar; Manish Misra; S. Joe Qin, all of Austin; Terrence L. Blevins, Round Rock; Richard C. Seemann, Georgetown, all of TX (US)

(73) Assignee: Fisher-Rosemont Systems, Inc., Austin, TX (US)

( * ) Notice: Subject to any disclaimer, the term of this patent is extended or adjusted under 35 U.S.C. 154(b) by 0 days.

(21) Appl. No.: 09/105,950

(22) Filed: Jun. 26, 1998

(51) Int. Cl.[7] ................................................ G06K 9/36
(52) U.S. Cl. ................................................ 382/240
(58) Field of Search ........................... 382/232, 233, 382/234, 235, 236, 238, 239, 240, 244, 246, 247, 248; 358/432, 433; 348/384, 394, 395, 398, 400–404, 407–416, 420, 421, 425, 430, 431, 699; 359/565, 569, 571, 573, 575, 721, 724, 741, 742; 702/75; 341/51, 60, 63, 65, 67, 107; 430/22, 321, 323, 324, 329

(56) References Cited

U.S. PATENT DOCUMENTS

| 5,262,958 | * | 11/1993 | Chui et al. ............................. | 702/75 |
|---|---|---|---|---|
| 5,651,099 | | 7/1997 | Konsella ................................ | 395/13 |
| 5,717,394 | * | 2/1998 | Schwartz et al. ...................... | 341/51 |
| 5,748,786 | * | 5/1998 | Zandi et al. .......................... | 382/240 |
| 5,748,955 | * | 5/1998 | Smith .................................... | 395/612 |
| 5,764,805 | * | 6/1998 | Martucci et al. ..................... | 382/236 |
| 5,808,683 | * | 9/1998 | Tong et al. ............................ | 348/403 |
| 5,867,602 | * | 2/1999 | Zandi et al. .......................... | 382/248 |
| 5,881,176 | * | 3/1999 | Keith et al. ........................... | 382/244 |
| 5,982,434 | * | 11/1999 | Tong et al. ............................ | 348/405 |
| 6,011,871 | * | 1/2000 | Xu ......................................... | 382/240 |
| 6,021,228 | * | 2/2000 | Byrd ...................................... | 382/240 |

FOREIGN PATENT DOCUMENTS

| 2 284 121 | 5/1995 | (GB) . |
|---|---|---|
| 2 324 220 | 10/1998 | (GB) . |
| WO 95/17783 | 6/1995 | (WO) . |
| WO 98/44740 | 10/1998 | (WO) . |
| WO 98/56184 | 12/1998 | (WO) . |

OTHER PUBLICATIONS

Search Report Under Section 17 from the Great Britain Patent Office, dated Oct. 27, 1999.

Kobayashi, "Wavelets and the Gorufu Boom," Siam News (Jul./Aug. 1997).

Reinhardt, "Videoconferencing Desktop Conferencing Takes Off," BYTE Magazine, pp. 24–25 (Jun. 1994).

* cited by examiner

Primary Examiner—Jose L. Couso
(74) Attorney, Agent, or Firm—Marshall, O'Toole, Gerstein, Murray & Borun

(57) ABSTRACT

A recursive on-line wavelet data compression technique which may be used in, for example, a process control network, compresses a stream of data points on-line or in real-time (e.g., as the data arrives or is generated) without requiring the storage of a large amount of uncompressed data. The data compression system includes a data receiver that receives the data points in a sequential manner and a compression tree computation device that determines approximation coefficients and detail coefficients of a multi-layer wavelet compression tree from the received data points. The compression tree computation device determines all of the coefficients of the higher level layers of the compression tree that can be determined after the data receiver receives each of the data points to thereby perform on-line or real-time data compression. A memory stores the determined approximation coefficients of the compression tree, a comparator compares the determined detail coefficient magnitudes or other error measurements to one or more thresholds to determine if construction of the compression tree should be halted and a compression data generator selects a subset of the determined coefficients to create a set of compressed data corresponding to the received data points when the comparator determines that construction of the compression tree should be halted.

21 Claims, 8 Drawing Sheets

RECURSIVE ON-LINE WAVELET DATA COMPRESSION TECHNIQUE FOR USE IN DATA STORAGE AND COMMUNICATIONS

BACKGROUND OF THE INVENTION

The present invention relates generally to data compression in data storage and data communication systems and, more particularly, to a recursive wavelet data compression technique for use in storing and communicating compressed data on-line in, for example, a process control network.

DESCRIPTION OF RELATED ART

Process plants such as chemical refinery plants and drug manufacturing plants typically include a large number of field devices that control and measure parameters or variables at various locations within a process. A field device may be a control device (such as a flow valve controller), a measurement device (such as a temperature gauge, pressure gauge, flow meter, etc.) and/or any other device that affects, displays, stores or determines a value or other data associated with a process. Until the past decade or so, field devices have been rather simple units that were either manually or electronically controlled to produce one or, at most, a couple of electrical readings which were then communicated to a user over-wire or via an attached gauge. Generally speaking, these devices used only analog signals to communicate limited information pertaining to the readings or measurements made thereby.

More recently, so-called "smart" field devices have been developed. A smart field device is a device that is capable of communicating with and providing a host, a controller and/or a management system associated with a process, detailed information acquired by or stored in the device. For example, some smart field devices are capable of transmitting an analog and/or digital signal indicating a process value associated with the device (such as a measurement value) while also being capable of storing and transmitting digital signals indicating detailed device-specific information, such as calibration, configuration, diagnostic, maintenance and/or process information. Smart devices may, for example, store and transmit the units in which the device is measuring, the maximum ranges of the device, whether the device is operating correctly, troubleshooting information about the device, how and when to calibrate the device, etc. Furthermore, a smart field device may be able to perform operations on itself, such as self-tests and self-calibration routines. Exemplary smart devices include devices that follow the HART® (Highway Addressable Remote Transducer) protocol (HART devices), the FOUNDATION™ Fieldbus protocol (Fieldbus devices), the PROFIBUS® protocol, the WORLDFIP® protocol, the Device-Net® protocol, and the CAN protocol. However, other smart device protocols exist or may be developed in the future to support different types of smart devices.

Within standard process control networks, smart devices, as well as other types of field devices such as host devices, which may be controllers, data storage devices, user interface devices, etc., may be connected to a process controller via a dedicated line associated with each device or, alternatively, via a bus which interconnects all or at least a portion of the devices. Other process control networks, such as so-called distributed process control networks (in which control functions are performed by numerous control elements spread throughout the process control network) may have one or more buses interconnecting the devices needed to effect process control. Although many communication protocols, like those identified above, have been developed for process control communication networks, these control networks typically rely on only one (or a very limited number) of buses for all of the communication activities. In most systems, especially in larger systems, this fact places a premium on optimal usage of the bus. In fact, the more devices connected to the bus and the more information or data that is sent over the bus by the devices connected thereto, the more likely it is that bottlenecks will occur on the bus. These bottlenecks can result in lost data and reduced performance of the process control network. Furthermore, the increase in data communication capabilities of process control networks often taxes the ability of data storage devices, such as data libraries (data historians), to collect and store the data being sent over a bus. A recent move in the industry to use the process control bus to transmit video images, such as those taken by a video camera located somewhere within the process network, adds a significant load to the data traffic on the process bus and exacerbates the problem.

As is evident, it is desirable to configure a process control system (or any other communication network) to be capable of communicating as much data as possible using a given amount of bus bandwidth. Likewise, it is desirable to store as much data as possible using as little memory as possible in, for example, process control networks. In order to reach these goals, prior process control systems have used data compression techniques to compress data being stored in a storage device. However, most prior art data compression techniques used in process control systems have not been entirely satisfactory in reducing the amount of storage space required to store a given amount of data. Furthermore, prior art process control networks have not been able to reduce the bus bandwidth needed to communicate a given amount of data over a bus because they have not been capable of communicating compressed data via the bus.

Generally speaking, prior art process control networks that have compressed data for the purpose of data storage have used interoperative compression techniques, like the box car compression technique and the backward slope interpolation technique. Interpolative compression techniques typically use lower order interpolation such as zero order interpolation (e.g., the box car method) or first order interpolation (e.g., the backward slope method) over the current point and the last few recorded points to decide whether it is useful to store the current point. While these methods are fast and, therefore, may be used on-line or in real-time to compress and store incoming data, the decisions made by these methods are based on only a few points and, thus, these methods provide relatively poor performance.

Wavelet data compression techniques, on the other hand, have been shown to perform better than interpolative compression techniques with respect to various criteria like mean, square error, local point error, empirical transfer function ratio and cumulative scale error, mostly because wavelet data compression techniques take a greater number of data points into account when compressing data. However, wavelet data compression methods require a large set or window of data, such as all of the data corresponding to a particular video image or some other physical entity or logical unit, to be available in memory before compression can begin. As a result, known wavelet data compression techniques which have been applied in prior art data compression systems are relatively slow and inefficient because they sit inactive for a period of time while collecting an entire window of data and then must operate at high data processing speeds to compute the wavelet coefficients necessary to perform wavelet data compression. Likewise, wavelet data compression techniques require a relatively large amount of storage space to be set aside for uncompressed data during the compression process. Both of these factors make prior art wavelet data compression techniques unsuitable for use in real-time or on-line data compression wherein it is desirable to compress the incoming data efficiently in real-time while storing only a minimal amount of uncompressed data points.

SUMMARY OF THE INVENTION

The present invention is directed to a real-time or on-line data compression technique that has the speed, efficiency and on-line implementability of known interpolative compression techniques while maintaining the minimal storage qualities and accuracy or performance qualities of known wavelet data compression techniques. The compression technique of the present invention may be used in a communication system, such as a process control network, to store compressed data in a data library (to thereby reduce the memory requirements of the network) and may be used to communicate compressed data over a bus (to thereby reduce the bandwidth requirements of the bus) while still providing real-time data compression.

According to one aspect of the present invention, a process control system having numerous process control devices communicatively connected via a bus, compresses data before placing that data on the bus, sends the compressed data over the bus to, for example, or a memory unit such as a data library, and stores the compressed data in the memory unit in the compressed format. Such a system reduces the bandwidth associated with the communicated data which, in turn, enables more data to be sent over the bus and/or more process control devices to be connected to the bus.

According to another aspect of the present invention, a recursive on-line wavelet data compression technique compresses data on-line or in real-time (e.g., as the data arrives or is generated) without requiring the storage of a large amount of uncompressed data, such as all of the data associated with an entire video image.

Generally speaking, a data compression system which compresses a stream of data points according to one aspect of the present invention includes a data receiver that receives the data points in a sequential manner and a compression tree computation device that determines a multi-layer compression tree from the received data points. The determined compression tree may be a wavelet compression tree that includes coefficients in a zero level layer that are equal to the stream of data points and coefficients in one or more higher level layers that are determined from the coefficients in a lower level layer. A memory within the data compression system stores the determined coefficients of the compression tree and a compression data generator selects a subset of the determined coefficients to create a set of compressed data corresponding to the received data points. The compression tree computation device determines one of the coefficients of one of the higher level layers after the data receiver receives a first one of the data points but before the data receiver receives a second one of the data points to thereby perform on-line or real-time data compression.

Preferably, the compression tree computation device includes a compression tree coefficient calculator that calculates all of the coefficients of the higher level layers of the compression tree that can be calculated from the stored coefficients of the compression tree after receipt of each one of the data points. A data remover may remove a coefficient from the memory when that coefficient is no longer required to directly calculate any coefficient in a higher level layer of the compression tree to thereby minimize the memory requirements of the data compression system.

In one embodiment, the memory of the data compression system is a stack memory that includes a separate stack associated with each level of the multi-level compression tree. Preferably, each stack memory has N memory locations, wherein N is the size of the wavelet filter used to compute the compression tree. The memory may also include a padding stack that stores padding data points used to compute the initial tree coefficients within each layer of the multi-layer compression tree. The padding stack may be designed to perform symmetrical padding and to include N-2 memory locations.

The compression data generator may select the compressed data to include a set having all of the compression tree coefficients in the compression tree that, were further coefficients to be added to the compression tree, would be required to directly calculate a higher level coefficient of the compression tree but not to include any coefficients that can be completely calculated from other coefficients in the set. The compression data generator may further include an index generator that generates an index specifying which coefficients were selected by the compression data generator as the compressed data. Preferably, the index generator generates an index that corresponds to the location in the compression tree of the coefficient, selected by the compression data generator as part of the compressed data, that was last determined by the compression tree computation device.

The data compression system may also include a comparator that compares the determined coefficients with a threshold and the compression data generator may select the compressed data, i.e., halt construction of the compression tree, when the comparator determines that one of the determined coefficients is greater than the threshold. The comparator may store a predetermined threshold for each layer of the compression tree greater than the zero level layer and compare the coefficients for a particular level of the compression tree to the stored threshold associated with the particular level. Alternatively, the comparator may be an adaptive comparator that calculates the accumulated root mean squared error and/or the local point error and that compares these values with thresholds specified by a user to determine if construction of the compression tree should be halted at any particular point within the tree.

If desired, the compression tree computation device may recursively calculate a wavelet compression tree by computing an approximation coefficient and a detail coefficient for each of the points in the compression tree at levels greater than the zero level layer. In this case, the memory stores the approximation coefficient for each of the points while the comparator may compare the detail coefficient for each of the points to a threshold.

The data compression system of the present invention may also include a data decompression device having a receiver that receives the compressed data, a memory that stores the received compressed data and a reverse compression tree generator that calculates points in the compression tree from the stored compressed data as each of the compressed data points is received, to thereby recover an approximation of the initial stream of data points delivered to the data compressor.

According to another aspect of the present invention, a computer implementable data compression routine stored on a computer readable medium for use in compressing a series of data points receives the series data points and, after receiving each one of the series of data points, (1) determines each point in the multi-level compression tree that can be determined from the received data point and previously stored points of the multi-level compression tree, (2) stores the determined points in the memory, and (3) decides if the construction of the multi-level compression tree should be halted by comparing a threshold to a value associated with one of the determined points. When the routine decides that the construction of the multi-level compression tree should be baited, the routine develops a set of compressed data from the stored points.

According to another aspect of the present invention, a data compression system for use in a process control network including a plurality of process control devices communicatively linked via a bus includes a data compressor in at least one of the plurality of process control devices that compresses device data, such as video data, generated by one of the plurality of process control devices, to thereby produce compressed data. A communicator in one of the plurality of process control devices communicates the compressed data to a second one of the plurality of process control devices via the bus and a decompression unit located in the second one of the plurality of process control devices decompresses the compressed data to produce decompressed data corresponding to the device data.

The further one of the plurality of process control devices may be a data historian having a memory capable of storing the compressed data, a user interface device that displays the decompressed data or a process controller that uses the data developed from the compressed data to control the process.

If desired, the data compressor may be a recursive wavelet data compressor that uses a recursive wavelet data compression technique to compress the device data. In such a system, the recursive wavelet data compressor recursively constructs a wavelet compression tree having a multiplicity of levels and generates the compressed data from the wavelet compression tree.

According to a still further aspect of the present invention, a method of transferring data within a process control network having a plurality of process control devices communicatively interconnected by a bus includes the steps of generating data in a multiplicity of the process control devices, compressing the data generated in each of the multiplicity of the process control devices and transmitting the compressed data from each of the multiplicity of process control devices to other ones of the plurality of process control devices over the bus. A portion of the compressed data from at least one of the multiplicity of the process control devices is received at a further process control device and the received compressed data is decompressed at the further device.

In another embodiment of the present invention, a method or computer-implementable routine for adaptively thresholding data for use in a data processing routine including the steps of collecting a series of sequential data points and, after collecting each of the series of sequential data points, determining an aggregate error variable based on the data points within the collected series of sequential data point. The aggregate error variable is then compared to a threshold. The steps of determining the aggregate error variable and comparing the aggregate error variable to the threshold are preferably performed after the receipt of a first data point in the series of sequential data points and before receipt of a second data point that immediately follows the first data point in the series of sequential data points. The aggregate error variable may be determined in a recursive manner and may comprise one or more of a local point error variable, a root mean squared error variable and/or a sum squared error variable. If desired, the aggregate error variable may be set to zero and a new series of, for example, three or more sequential data points may be collected when the aggregate error variable is determined to be greater than the threshold.

DESCRIPTION OF THE PREFERRED EMBODIMENTS

Figure 1:
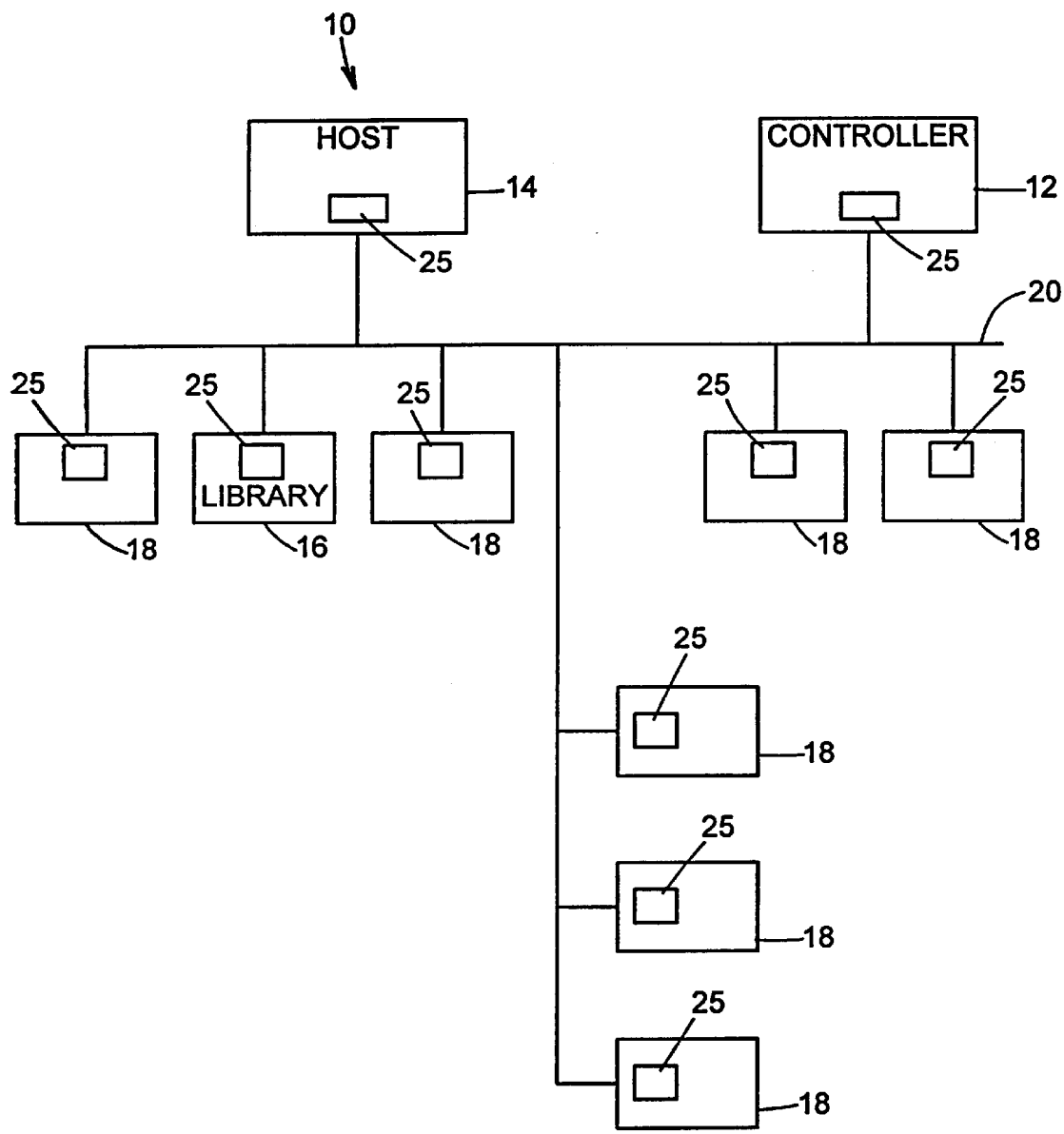
FIG. 1 is a block diagram of a process control network that stores and transmits compressed data over a bus according to the present invention.

Referring now to FIG. 1, a process control network 10 includes a controller 12, a host 14, a data historian or data library 16 and numerous other field devices 18 all interconnected via a bus 20. The controller 12 may be, for example, a distributed control system controller or any other type of controller implemented in, for example, a stand alone personal computer or in a network computer. The host device 14 may also be, for example, a personal computer or other device that allows a user or an operator to interface with the process control system 10 in any known manner. If desired, the host 14 may include storage for a data historian, a user interface, a controller, etc. The data historian 16 may be any type of known memory or storage device including, but not limited to, a digital disk storage device (such those using compact disks, digital video disks, laser disks, etc.), a RAM storage device, a magnetic disk storage device, etc. Each of the field devices 18 may be any type of field device used in the process control network 10 including, for example, sensors, controllers, control valves, positioners, fans, video cameras, microphones, etc. Of course, other devices may be connected to the bus 20 and, furthermore, the devices 12, 14, 16 and 18 may be interconnected via the bus 20 in any desired configuration. Likewise, the bus 20, which may be any type of bus that uses any desired communication protocol, such as the FIELDBUS protocol, the HART protocol etc., may be configured in any desired manner. For example, the bus 20 may have any number of segments or branches and may interconnect any number of devices to allow communication therebetween.

As illustrated in FIG. 1, each of the devices 12, 14, 16 and 18 within the process control network 10 includes a compression/communication network 25 therein. Each of the compression networks 25 is capable of compressing data developed by or stored in the associated device and includes a communicator that sends this compressed data over the bus 20 to another device, such as the data historian 16, the controller 12 or the host 14. Likewise, if necessary, each of the compression networks 25 is capable of decompressing compressed data received via the bus 20. The compression network 25 for any particular device may be implemented in software that is stored in a memory associated with the device and performed on a computer or other processor (such as a micro-processor) associated with the device. Of course, a device may include a separate computer which implements the compression network 25 but, typically, a device will include a computer that implements the compression network along with performing other tasks associated with the device. Alternatively, the compression network 25 may be implemented in hardware, firmware or other standardized or specialized computing devices.

Generally, the compression networks 25 operate within the communication protocol associated with the process control network 10 using communicators already within the devices connected to the bus 20, which enables compressed data to be sent over the bus 20 in the same way that uncompressed data is sent over the bus 20. However, because compressed data is being sent over the bus 20, the flow of traffic on the bus is reduced, which enables more devices to be connected to the bus 20. Of course, any types of data communicators may be used, including, for example, HART, FIELDBUS, etc. data communicators, which are generally configured according to the well-known Open Systems Interconnect (OSI) layered communication model.

While the compression networks 25 may implement any desired compression technique to compress data to be communicated over the bus 20, each of the compression networks 25 preferably implements a recursive, on-line compression (and/or decompression) technique such as that disclosed hereinafter to compress (and decompress) the data sent over the bus 20. Also, while it is preferable that each of the devices connected to the bus 20 have a data compression network 25 that performs both compression and decompression so that all or most of the data communications over the bus 20 are performed using compressed data, this need not be the case. Thus, particular devices may have a compression network that only decompresses incoming data (because the device may not need to communicate data over the bus 20) or that compresses only outgoing or transmitted data (because the device may not need to receive data over the bus 20). In some cases, one or more of the devices connected to the bus 20 may not need to have a data compression network 25 therein. For example, the data historian 20 may not need a data compression network because it may merely receive compressed data, store the compressed data in memory and, upon receiving a command, retrieve and transmit the compressed data over the bus 20 to a requesting device. Likewise, if desired, some devices within the process control network 10 may transmit uncompressed data while others transmit compressed data. However, this technique is more complicated and is not the most preferred. Still further, the compression networks 25 may compress all or only a selected subset of the information sent over the bus 20. Thus, for example, all of the communication information on the bus 20 (including device data as well as communication overhead such as commands, requests, etc.) may be transmitted over the bus 20 in a compressed format. However, this configuration is not typically necessary because standard communication commands, requests, etc. do not generally require a large amount of bus bandwidth as compared to data collected or generated by the devices connected to the bus 20. Thus, typically, it is only necessary to compress (and decompress) data sent over the bus 20.

The compressed data communication network described herein is particularly useful in process control systems that send large amounts of data to or that collect large amounts of data from field devices, especially high bandwidth data like video imaging data, audio communication data, etc. Thus, in one embodiment, one or more of the field devices 18 of the process control network 10 may be video displays, video cameras, microphones, speakers etc. that are communicatively connected to, for example, the controller 12 or the host 14 to allow video and/or audio communication between different locations within a process plant. Using this configuration, an operator located at, for example, the host device 14, can actually view, in real-time, the output of a video camera located somewhere else within a process plant and can talk to (or hear) individuals at remote locations within the plant using only the hardware already connected to the process control network 10. If desired, however, other devices, such as the controller 12, may receive compressed data, decompress that data and use the decompressed data to control the process.

Still further, because the present invention preferably uses the recursive wavelet data compression technique described herein, it provides a lower amount of loss in performance as compared to other compression techniques while still providing for real-time communications. Likewise, the recursive wavelet data compression technique described herein does not require the use of large memories for storing uncompressed data during the data compression routine, as is required by standard wavelet data compression techniques.

Figure 2:
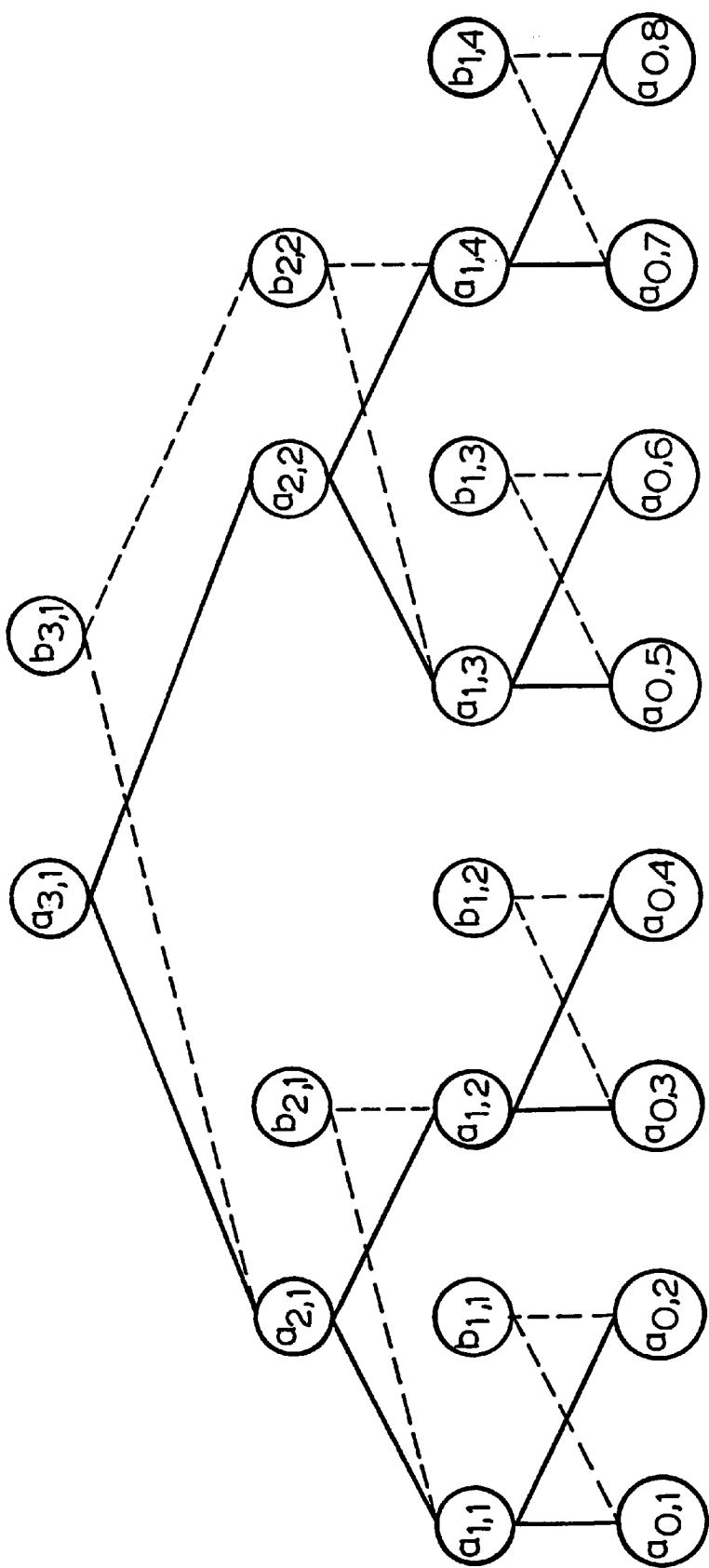
FIG. 2 is a tree diagram illustrating a standard wavelet data compression tree associated with a wavelet data compression technique.

Generally speaking, a standard wavelet data compression technique operates by building a multi-level compression tree, such as that illustrated in FIG. 2, having a series of points associated with each level. Each point of the compression tree has an associated approximation coefficient, which represents an approximation of an average of a set of data, and an associated detail coefficient, which represents high frequency information. A standard wavelet data compression technique may be thought of as applying an approximation filter of length n to a set of data to produce an approximation coefficient and applying a corresponding detail filter, which can be obtained based on the difference between the output of the approximation filter and the actual data, to produce a detail coefficient at each point of the compression tree. Of course, the associated approximation coefficients and the detail coefficients may be used to reconstruct the original data. With reference to FIG. 2, the approximation coefficient for a particular point in the tree is labeled as $a_{j,k(j)}$ where j indicates the tree level and k(j) indicates the time value of the point at level j of the tree. Likewise, the detail coefficient for a particular point in the tree is labeled as $b_{j,k(j)}$. In FIG. 2, the zero order level (the finest scale), which represents the actual raw data, is indexed with j=0 and, as j increases, coarser and coarser scales are reached. The time indices k(j) always start with k(j)=1 for every scale or level j. Using these notations, the following equations summarize the creation of wavelet compressed data, i.e., the points of a wavelet compression tree of a known wavelet data compression technique.

$$a_{j+1,k} = \sum_{i=0}^{n-1} h(i) a_{j,2k-n+i+1} \quad (1)$$

wherein:

$a_{j,k(j)}$=the approximation coefficient at level j for time index k(j) (corresponding to level j) of the compression tree;

n=the filter length used to create the compression tree; and h(i)=the ith coefficient for the wavelet filter (this may be, for example, a HAAR compression filter where n=2).

$$b_{j+1,k} = \sum_{i=0}^{n-1} (-1)^i h(n-i-1) a_{j,2k-n+i+1} \quad (2)$$

wherein:

$b_{j,k(j)}$=the detail coefficient for the level j and the time index k(j) (corresponding to level j) of the compression tree;

n=the filter length used to create the compression tree; and h(i)=the ith coefficient for the wavelet filter (i=0, 1, . . . n−1).

Thus, generally speaking, for a set of data of length n, equations 1 and 2 are successively applied to develop the approximation coefficients $a_{j,k(j)}$ and the detail coefficients $b_{j,k(j)}$ at the different levels j of the compression tree to produce a compression tree such as that illustrated in FIG. 2. After the compression tree is completed, all the approximation coefficients and detail coefficients that are over a predetermined threshold are sent or are stored as the compressed data corresponding to the set of raw data (i.e., the data at the level j=0). Usually, only the approximation coefficients for the highest level are stored if the detail coefficients are minimal, i.e., are less than a particular threshold. However, both the approximation coefficients for the highest level and the detail coefficients for all of the tree points may be stored to allow complete recovery of the raw data.

As will be understood, the compression tree of FIG. 2 is constructed using eight raw data points (j=0) and has four levels, i.e., levels 0 to 3. As indicated above, the lowest level (j=0) corresponds to the raw data points, which may be the actual data being developed by a device to be sent over the bus 20 of FIG. 1 or to be stored in a data historian, such as the data library 16 of FIG. 1. The compression tree of FIG. 2 is developed for a wavelet compression routine using a filter length of two (n=2) so that the approximation coefficients of any particular point in the compression tree are developed from the two approximation coefficients of points in the level directly therebelow. For example, the approximation coefficient $a_{1,1}$ is developed from the $a_{0,1}$ and the $a_{0,2}$ approximation coefficients (i.e. raw data points) and is illustrated in FIG. 2 as being connected to these points by solid lines. Likewise, the second level approximation coefficient $a_{2,1}$ is developed from the $a_{1,1}$ and the $a_{1,2}$ approximation coefficients, etc. As indicated by dotted lines in FIG. 2, the detail coefficient for any point is developed from the approximation coefficients of n (n=2 in FIG. 2) points in an immediately preceding level. Thus, the $b_{1,2}$ detail coefficient is developed from the $a_{0,1}$ and the $a_{0,2}$ approximation coefficients. As will be noted, the first level (j=0) of the compression tree has no (i.e., zero-valued) detail coefficients because the approximation coefficients of this level equal the values of the raw data points.

As is evident from the compression tree of FIG. 2, the eight data points of the first level (j=0) may be compressed using wavelet compression to develop the single third level data approximation coefficient $a_{3,1}$ and, if necessary, a single detail coefficient $b_{3,1}$. Once the entire compression tree has been calculated or determined (which occurs only after the entire set of raw data is received), the compression tree may be stored or communicated in compressed format by storing or communicating the approximation coefficient of the highest level of the tree ($a_{3,1}$) along with all of the detail coefficients that are over a predetermined threshold. From these points, the raw data points (or a close approximation thereof) may be developed. Of course, the actual raw data points may only be determined from the compressed data if all of the detail coefficients are stored or communicated, which is generally not practical.

However, as indicated above, it is generally necessary to have all of the raw data points, i.e., $a_{0,1}$–$a_{0,8}$ available before beginning calculation of the approximation coefficients and the detail coefficients of the higher levels of the compression tree. Likewise, in a decompression system, it is necessary to receive all of the approximation coefficients and detail coefficients associated with a compressed tree before beginning to reconstruct the raw data points. Furthermore, because the compression system (or decompression system) does not know how many points are to be received or how large the set of compressed data corresponding to a tree will be beforehand (because all detail coefficients greater than a predetermined threshold are typically sent), it is necessary to send or store an index with each point of the compressed data indicating the position in the tree that is being represented by the data point. For example, when sending or storing the approximation coefficient $a_{1,3}$, the compression system must also send or store an index indicating what type of data point (e.g., approximation coefficient or detail coefficient) is being sent and what tree level and time value are associated with that point.

As will be understood, to compress data using a standard wavelet data compression technique, all of the raw data points associated with a tree must first be received and stored to determine how large the tree will be. Next, the tree must be developed by calculating all of the approximation and detail coefficients of the tree. Thereafter, the desired approximation coefficients and detail coefficients (and an index associated with each) must be stored or communicated as the compressed data. As noted hereinbefore, this technique requires the collection and storage of a large group of raw data before compression processing can begin. This fact makes this technique sub-optimal for on-line compression applications, such as sending live video data over a bus, because it creates times of low processing demand (when the system is waiting for all of the raw data to be received) and times of high processing demand (when the system must calculate the compression tree for a group of received and stored data). Furthermore, this technique requires a large memory to store the received data points prior to calculation of the compression tree.

The recursive wavelet data compression technique of the present invention overcomes these problems by calculating a wavelet compression tree in a recursive manner, e.g., as the raw data is generated or delivered to the compression unit. As a result, this technique does not have to wait for a large set or window of data to arrive before developing compressed data associated with the raw data, which spreads out the processing load and significantly reduces the amount of storage required for uncompressed data. Furthermore, the compressed data may be sent or stored very frequently, which limits the necessity of having to send a lot of compressed data all at once. Generally speaking, the recursive wavelet data compression technique according to the present invention differs from the standard wavelet compression technique because it calculates each of the points at each of the different levels of the compression tree as the data necessary for the calculation of that point becomes available.

More particularly, during operation, the recursive wavelet data compression technique of the present invention accepts a raw data point and determines if a point in a higher level of the compression tree can be calculated. If so, the compression technique calculates the higher point (i.e., the approximation coefficient and the detail coefficient for that point) and determines if any other higher level points can be calculated. When no more higher level points can be calculated based on the receipt of the raw data point, the compression technique accepts the next raw data point and repeats the process, thereby building the tree as the raw data points are received.

Figure 3:
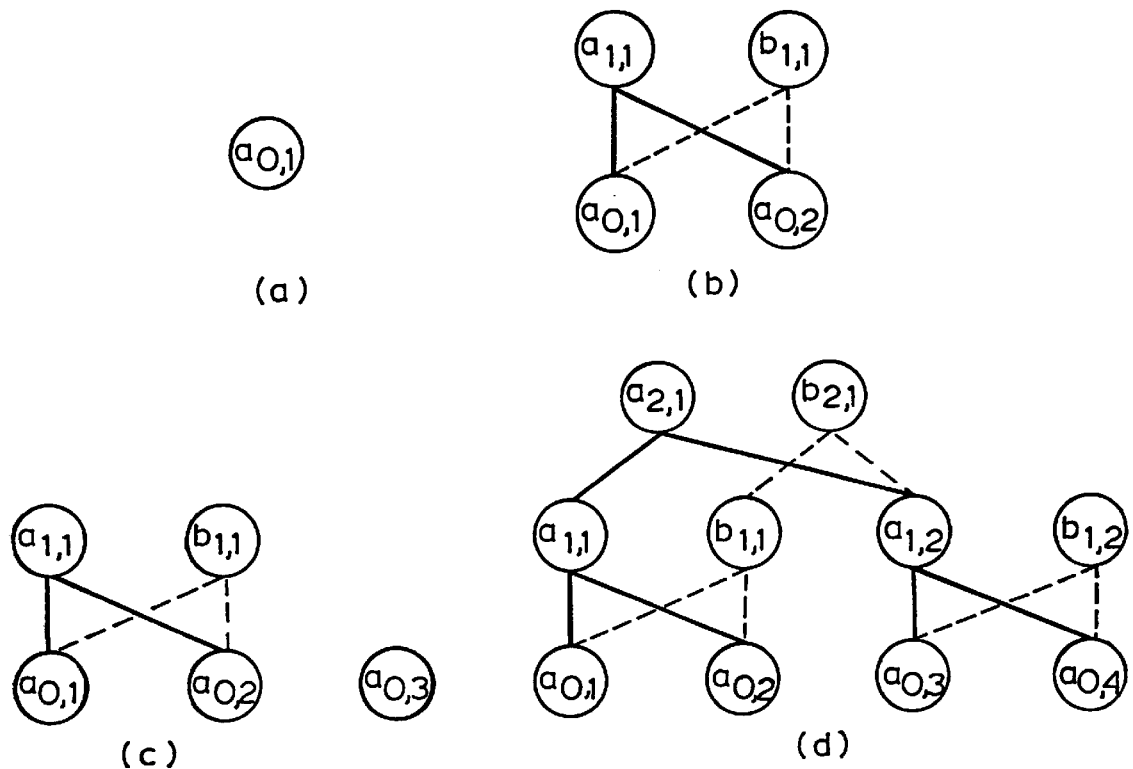
FIG. 3 is a set of four tree diagrams illustrating different stages of the construction of a compression tree using the recursive wavelet data compression technique according to the present invention.

This process is illustrated in FIG. 3, which depicts a compression tree (constructed using a filter length of two) at different stages during its construction using the wavelet data compression technique according to the present invention. At a step (a) the first data point ($a_{0,1}$) is received and is placed in the compression tree. At a step (b), the next data point ($a_{0,2}$) is received and is placed in the compression tree. At this time, the higher level coefficients $a_{1,1}$ and $b_{1,1}$ are calculated from equations (1) and (2) respectively (because they now can be), and are placed in the compression tree. Because no further higher level coefficients can be calculated, the process moves to step (c) wherein the next data point ($a_{0,3}$) is received and is placed in the compression tree. At a step (d), the data point ($a_{0,4}$) is received and is placed in the compression tree. The first level coefficients $a_{1,2}$ and $b_{1,2}$ are then calculated (because enough data is now available to do so) and are placed in the compression tree. Thereafter, the second level coefficients ($a_{2,1}$ and $b_{2,1}$ are calculated, again because enough of the lower level coefficients are available to do so, and are placed in the compression tree. This process of adding raw data points at the zero level layer of the compression tree and computing all of the possible higher level coefficients therefrom is repeated to build the compression tree in a recursive manner, i.e., as the data used to make that tree becomes available.

Each time the approximation and detail coefficients for a point in the tree are determined, the detail coefficient is compared to a threshold, which may be different for different levels of the tree. If the magnitude of the detail coefficient is greater than the threshold, computation of that compression tree is halted in order to prevent the significant loss of information when recovering the raw data during decompression. Thereafter, a minimal set of approximation coefficients within the existing tree, along with the level and time index of the "last" approximation coefficient (bookkeeping information) added to the tree, are transmitted or are stored as the compressed data associated with the received raw data. A new tree is then constructed, beginning with the next raw data point received by the compression unit.

A compression system using this recursive technique can generally be said to sequentially develop a series of different compression trees, each of which may be of a different size, as raw data arrives. The compression system then sends or stores, as the compressed data, a minimal set of approximation coefficients associated with each compression tree when it is determined that further construction of the compression tree may lead to the significant loss of data and, therefore, significant error, during decompression. It should be noted that, for a compression tree of any given size, the same set of approximation coefficients will always be sent or stored as the compressed data. As a result, the index associated with a tree needs only to specify how large the tree is (i.e., at what stage its construction was halted) because, with that information, the decompression system can automatically determine how many data points are associated with the compressed data developed from the tree and to which points in the tree these data points correspond. Furthermore, because the detail coefficients are not sent or stored as part of the compressed data, there is no need to keep or store these values while constructing the compression tree.

Figure 4:
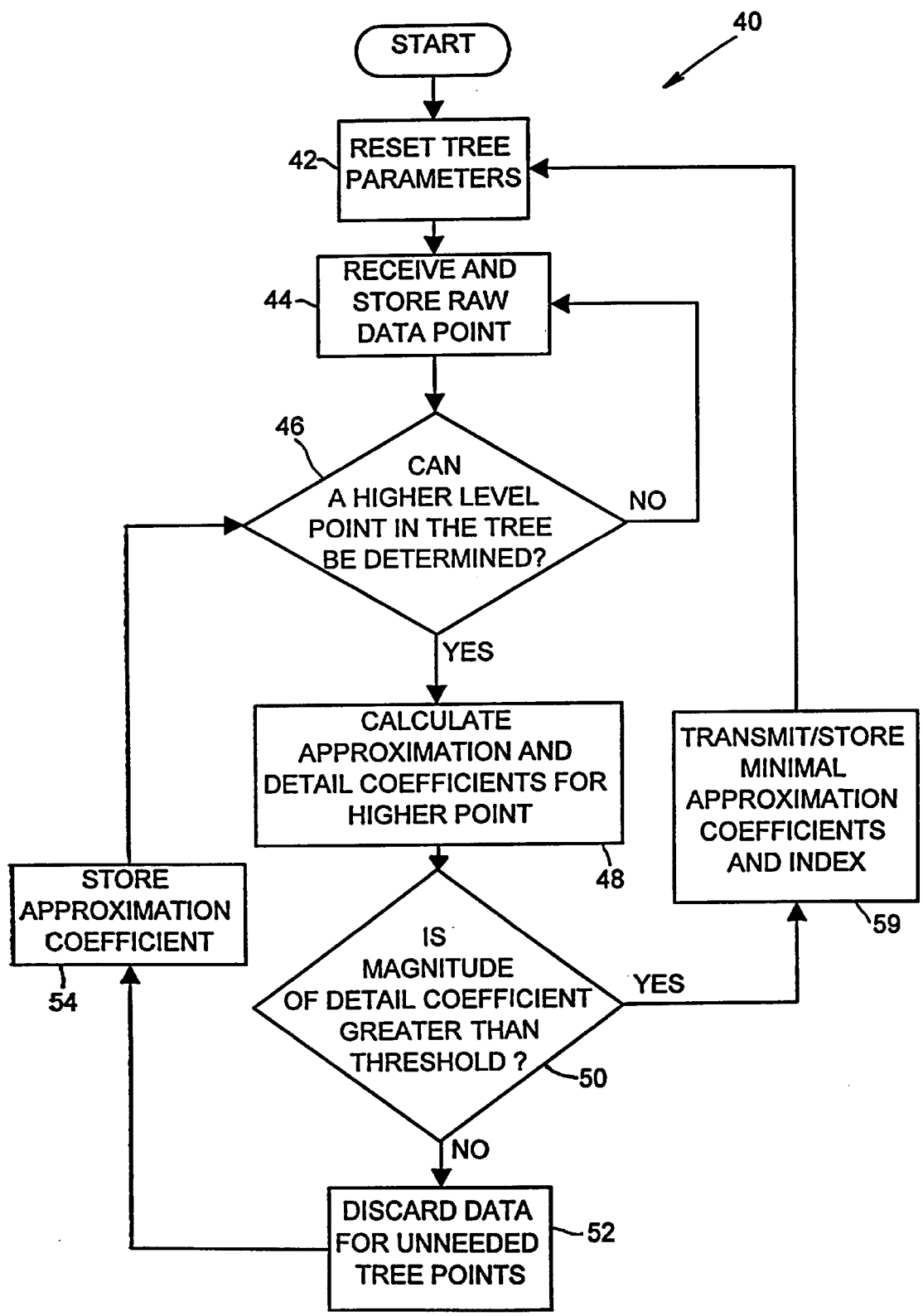
FIG. 4 is flow chart illustrating a recursive, wavelet data compression technique according to the present invention which may be used in the process control network of FIG. 1.

Referring now to FIG. 4, a flowchart of a routine or method 40 that compresses data using the recursive wavelet data compression routine of the present invention is illustrated. Of course the routine 40 may be implemented in software run on a programmable computer (such as a microprocessor) and stored on any computer readable medium, such as in RAM, ROM, on a laser or magnetic disk, etc. Alternatively, the routine 40 may be implemented in hardware or firmware as will be known by those skilled in the art.

In the routine 40, a block 42 begins construction of a compression tree by resetting all of the tree parameters. For example, the block 42 sets all of the approximation (and detail) coefficients at all levels of the compression tree to zero. Thereafter, a block 44 receives a new raw data point, which may be, for example, a digital data point developed by a field device, and stores this point as a level zero approximation coefficient in the tree. If video data is being compressed, the received point may represent a digital video signal or pixel. A block 46 then determines whether a higher level approximation coefficient in the compression tree can be calculated. Of course, whether an approximation coefficient can be calculated at any particular time depends on the size of the filter being used to construct the tree. For example, a tree using a filter of size two requires that two zero level approximation coefficients (raw data points) be available before an approximation coefficient for the first level can be computed. Of course, if the filter size is four, then four points must be available in any particular level before a point in the next higher level can be calculated.

When the block 46 determines that a higher level point within the tree can be calculated, a block 48 calculates the higher level point (i.e., the approximation coefficient and the detail coefficient) using, for example, equations (1) and (2) given above. Thereafter, a block 50 determines if the magnitude of the detail coefficient (or some other error value) is greater than a threshold established for the calculated point in the compression tree. This threshold may be predetermined or may be set according to the level with which the detail coefficient is associated and thus, may be different for different levels of the compression tree. When using a predetermined threshold, the process of setting this threshold is well-known to those skilled in the art and familiar with wavelet compression techniques and need not be further described herein. Suffice it to say, however, that the threshold for detail coefficients will typically increase in the higher levels of the compression tree because a greater amount of error (or loss in detail) is tolerable in higher levels of the tree. Alternatively, one or more thresholds may be compared to one or more statistical parameters of the compression tree, such as the root mean squared error or the local point error of the compression tree, at any particular point.

If the block 50 determines that the magnitude of the detail coefficient (or other measure) is not greater than the threshold, then a block 52 discards any unneeded coefficients (such as approximation coefficients) in lower levels of the tree. Tree coefficients become unneeded when, for example, all of the coefficients in the next higher level of the tree which require these coefficients for determination have been calculated. Thus, for example, when building the tree of FIG. 3, after the approximation coefficient $a_{1,1}$ and the detail coefficient $b_{1,1}$ have been calculated, the raw data points $a_{0,1}$ and $a_{0,2}$ can be discarded (at step (c)). Likewise, after the approximation coefficients $a_{2,1}$ and the detail coefficient $b_{2,1}$ have been calculated, the approximation coefficients $a_{1,1}$ and $a_{1,2}$ can be discarded (at step (d)). Of course, the number of coefficients discarded will depend on the filter size associated with the compression tree being constructed.

Next a block 54 stores the calculated approximation coefficient as part of the compression tree and returns control to the block 46 which determines if another higher level approximation coefficient can be calculated based on the generation of the new approximation coefficient stored by the block 54. The blocks 46, 48, 50, 52 and 54 repeat until the block 46 determines that no higher level approximation coefficients can be calculated based on the receipt of the last raw data point. At this point, control returns to the block 44 which accepts a new raw data point.

The loop configured of the blocks 44, 46, 48, 50, 52 and 54 repeats (thereby building a compression tree in a recursive manner as raw data points are received and discarding unneeded points within the compression tree) until the block 50 determines that the magnitude of the detail coefficient (or other value) is greater than its associated threshold. At this point, a block 59 sends or stores a set of minimal coefficients associated with compression tree being constructed (which are all of the approximation coefficients currently within the compression tree) along with an index (generally specifying the size of the tree) as the compressed data associated with the raw data used to build the compression tree. It should be noted that no detail coefficients are sent or are stored as part of the compressed data but, instead, these points are assumed to be zero by a decompression unit.

Thereafter, control is returned to the block 42 which resets the tree parameters to begin construction of a new compression tree. The routine 40 illustrated in FIG. 4 repeats in this manner to continuously build compression trees of varying sizes from raw data, as the data is received or generated, and to send or store compressed data developed from each tree when construction of that tree is halted. The routine 40 is thereby able to compress data on-line, e.g., in real time, as the data is received with only minimal processing and minimal storage within the compression unit.

As will be understood, the routine 40 (or any other routine that implements the recursive wavelet data compression technique of the present invention) implements a number of steps to build a compression tree and to maintain a minimal set of approximation coefficients which are transmitted or stored as compressed data. First, the routine receives a new data point ($a_{0,k(0)}$) and adds this point to the tree as the leaf node in the level zero approximation. The routine then updates two sets C and B as follows:

$$C = C \cup \{a_{0,k(0)}\} \quad (3)$$

wherein:

C=the minimal set of approximation coefficients at any given time;

k(j)=the time index at level j;

$a_{0,k(0)}$=the approximation coefficient at level zero and time k(0); and

'U'=indicates the union of two sets.

$$B = (0, k(0)) \quad (4)$$

wherein:

B=the level and time index of the last coefficient added to C; and (j,k(j))=the index indicating the approximation coefficient at the level j and the time k(j).

Whenever it can, the routine calculates the for a higher level ($b_{j,k(j)}$) and compares the magnitude of this detail coefficient to a threshold $t_j$. If the magnitude of the detail coefficient is less than the threshold, then the routine calculates the approximation coefficient for that level and time value (e.g., $a_{1,k(1)}$) using the necessary stored approximation coefficients in the lower levels of the tree. The sets C and B are then updated as follows:

$$C = C \cup \{a_{1,k(1)}\} - \{a_{0,2k(1)-1}, a_{0,2k(1)}\} \quad (5)$$

$$B = (1, k(1)) \quad (6)$$

assuming a filter length of two. Thereafter, the routine determines if any new higher detail and approximation coefficients can be calculated and, if so, repeats the steps of calculating the detail and approximation coefficients, comparing the magnitude of the detail coefficient to a threshold and updating the C and B sets. If the magnitude of the detail coefficient (e.g., $b_{1,k(1)}$) is greater than the corresponding threshold (e.g., $t_1$), then this value should not be ignored because the tree is getting out of range of accuracy and the sets C and B are dispatched as the compressed data. Thereafter, the tree is reset and construction of the next tree is begun. Note, however, that the entire set B need not be sent or stored as an index to the compressed data. Instead only one index, e.g., the index of the last approximation coefficient added to the set of minimal coefficients C, needs be sent as an index to the compressed data because the rest of the indices in the set B can be determined from this one index as will be described herein.

Figure 5:
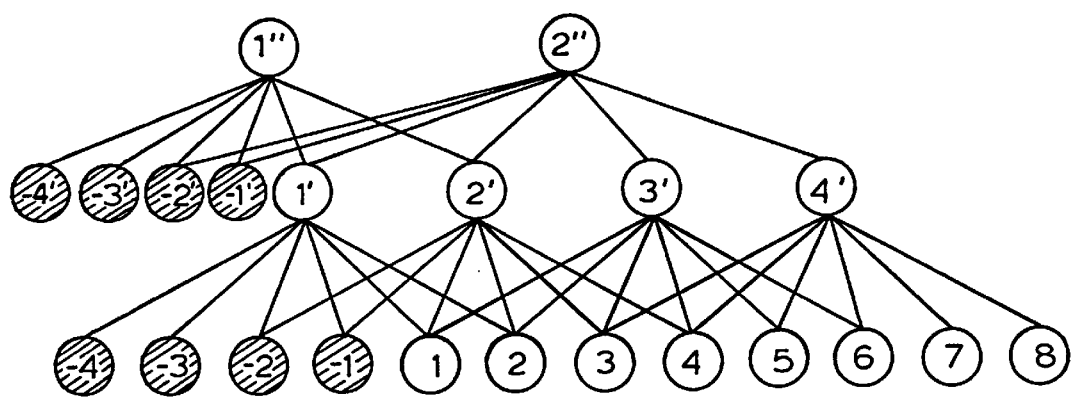
FIG. 5 is a tree diagram illustrating a padded wavelet data compression tree associated with a wavelet filter of six units in length that may be developed by the recursive wavelet data compression technique according to the present invention.

When building a compression tree, it may be necessary or desirable to provide artificial values at the beginning of each level of the tree to reduce the boundary effects of calculating higher level approximation coefficients. For example, in order to calculate coefficients in level one or higher of a tree constructed using a filter of length four or more, the compression routine requires the existence of negative time valued coefficients in each of the levels. Of course, these negative time values do not exist and, so, values therefore must be inserted artificially. This concept is generally called padding. FIG. 5 illustrates a compression tree that uses a filter of length six having four padding points (illustrated as shaded points) inserted into the negative time indexed locations for the zero and first levels thereof. For ease of notation, the time index of each point in the tree of FIG. 5 is indicated with a numeral (1, 2, 3, etc.) and the level of the tree is indicated by a prime notation. Thus, the notation 2' indicates the second time value at the first level of the tree while the notation 1" indicates the first time value of the second level of the tree. As illustrated in FIG. 5, calculation of the approximation and detail coefficients at the point 1' requires the use of four padded values and two actual values in the zero level of the tree. Similarly, the calculation of the approximation and detail coefficients at the point 2' requires the use of two padded values and four actual values in the zero level of the compression tree.

There are a number of types of padding which may be used in construction a compression tree including, for example, zero padding, symmetric padding and smoothed padding. In zero padding, the negative time indexed points (coefficients) are all set to zero. This type of padding leads to sharp discontinuities at the boundaries and has been found to yield high detail coefficients near the boundaries, which is undesirable. In symmetric padding, the negative time indexed points are set equal to the corresponding positive time indexed points. Thus, for example, the values of the approximation coefficients −1, −2, −3 and −4 are set equal to the approximation coefficients 1, 2, 3 and 4, respectively. This type of padding, which is illustrated in FIG. 5, has been found to yield low detail coefficients at the boundaries (because it preserves smoothness at the boundaries) without a lot of processing overhead. It is therefore considered a preferred type of padding. In smoothed padding, the padded points are extended using the first derivative of the function (the data points) at the boundary, thereby leading to complete smoothing. While this padding method provides the highest degree of smoothness at the boundaries, it requires significant processing overhead and is not considered very useful in some on-line applications where processing overhead must be kept at a minimum. Of course, any other types of padding may be used as well.

As will be understood, the number of approximation coefficients needed at the level j of a tree to compute the first time indexed coefficient at the level j+1 using symmetric padding is n−2, wherein n is the filter size used to construct the compression tree (n>2). Furthermore, the number of approximation coefficients at level j+1 that can be computed once the first n−2 coefficients at the level j are available is n/2−1.

Figure 6:
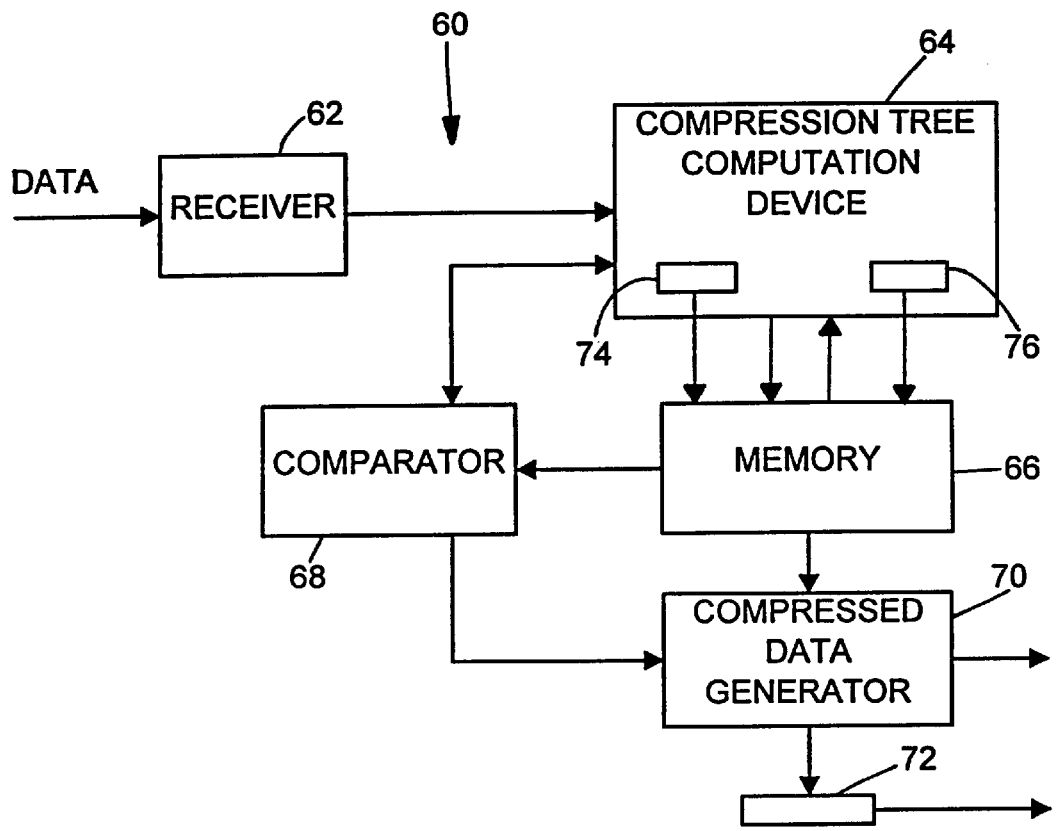
FIG. 6 is a block diagram of a system capable of performing the recursive wavelet data compression technique of the present invention.

Referring now to FIG. 6, a compression system 60, which may be used to implement the recursive, on-line wavelet data compression technique described herein, is illustrated in a block diagram form. The compression system 60 may be implemented as software in a computer or as hardware, firmware, etc. as desired. Of course, the compression system 60 may be implemented as a part of each of the compression networks 25 of FIG. 1.

As illustrated in FIG. 6, the compression system 60 includes a receiver 62 which receives a stream of data points to be compressed and which provides these data points to a compression tree computation device 64. The receiver 62 may be any type of data receiver, including, for example, an input port of a processor, a receiver/demodulator device, a stack, software within a processor for obtaining data from a device or a bus, etc.

The compression tree computation device 64, which may be implemented in software in a processor, in hardware or firmware, etc., calculates or determines coefficients, such as approximation coefficients and detail coefficients from the data received by the receiver 62. The compression tree computation device 64 stores the calculated coefficients, such as the approximation coefficients, in a memory 66, and may use some or all of the calculated coefficients stored in the memory 66 to determine points in higher level layers of the compression tree. Likewise, the compression tree computation device 64 provides the detail coefficients (or other points) to a comparator 68, which compares these coefficients (or the magnitudes thereof) to one or more thresholds to determine if construction of the current compression tree should be halted. If desired, the comparator 68 may store a single threshold, multiple different thresholds, one to be used, for example, at each different level of the compression tree, or may adaptively calculate a cumulative error measurement and compare that to a threshold as will be described herein.

In any event, when the comparator 68 determines that the construction of the current compression tree should be halted, it notifies a compressed data generator 70, which uses the coefficients stored in the memory 66 to generate a set of compressed data. An index generator 72, generates an index for the set of compressed data and both the coefficients selected by the compressed data generator 70 and the index generated by the index generator 72 are sent out as a set of compressed data corresponding to the raw data received by the receiver 62.

If desired, the compression tree computation device 64 may include a padding data generator 74, which creates padding data for each compression tree and a data remover 76 which removes data, such as approximation coefficients, from the memory 66 when that data is no longer needed to directly calculate a higher level point (coefficient) in the current compression tree. The data remover 76 allows the size of the memory 66 to be kept at a minimum by removing data from the memory 66 when it is no longer needed to build a compression tree or when it is no longer needed as compressed data.

Of course, the comparator 68, the compressed data generator 70 and the index generator 72 (as well as any of the other components of FIG. 6) may be implemented in software, hardware, firmware, etc. in any manner desired.

Figure 7:
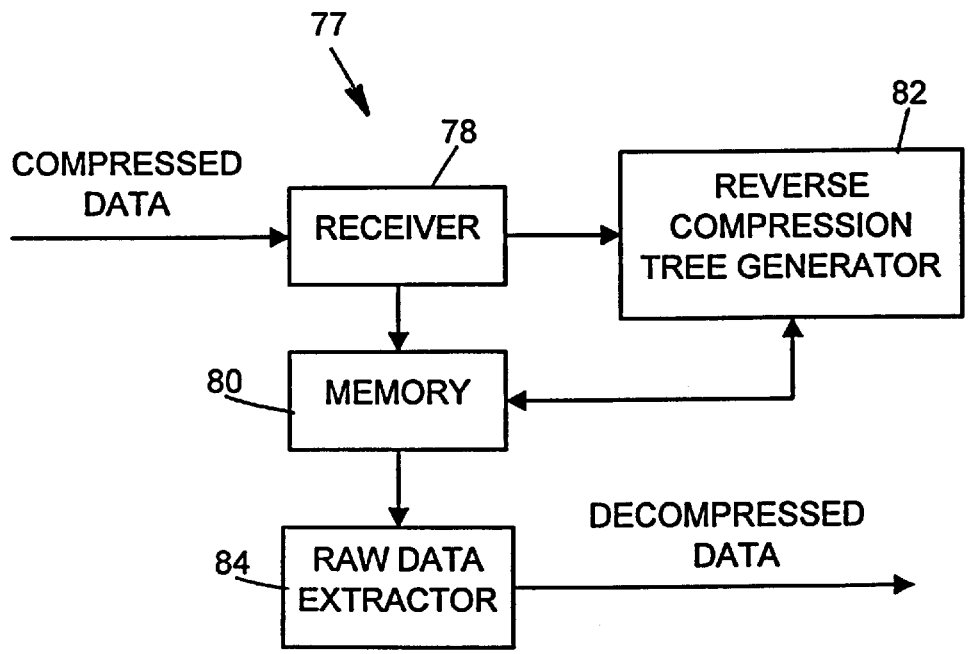
FIG. 7 is a block diagram of a system capable of performing data decompression according to the present invention.

Referring now to FIG. 7, a data decompression system 77 is illustrated as including a compressed data receiver 78, which may be similar to the receiver 62 of FIG. 6, a memory 80, a reverse compression tree generator 82 and a raw data extractor 84. The receiver 78 receives the compressed data, including the index sent therewith, and delivers the compressed data to the reverse compression tree generator. The reverse compression tree generator 82 (or the receiver 78) uses the received index to determine the size of the compression tree associated with the compressed data, as well as to determine which and how many compression tree coefficients to expect for a particular compression tree. After receipt of each new data point associated with a particular set of compressed data (which is typically stored in the memory 80), the reverse compression tree generator 82 develops all of the lower compression tree approximation coefficients that can be determined using the received data point and the compression tree coefficients stored in the memory 80 and then stores these developed coefficients in the memory 80. To calculate the lower points in a compression tree, the reverse compression tree generator 82 may use the following equations:

$$a_{j,2} = \sum_{i=0}^{\frac{n}{2}} a_{j+1,k+i} h(n-2i-1) + \sum_{i=0}^{\frac{n}{2}} b_{j+1,k+i} h(2i) \qquad (7)$$

$$a_{j,2k+1} = \sum_{i=0}^{\frac{n}{2}} a_{j+1,k+i} h(n-2(i+1)) - \sum_{i=0}^{\frac{n}{2}} b_{j+1,k+i} h(2i+1) \qquad (8)$$

wherein:

$a_{j,k}$=the approximation coefficient at level j for time index k (corresponding to level j) of the compression tree;

n=the filter length used to create the compression tree; and h(i)=the ith coefficient of the wavelet filter (i=0, 1, . . . n−1).

Of course, because the detail coefficients ($b_{j,k}$) are set to zero, the right-hand summation of each of equations (7) and (8) is always zero, making computation of these equations more simple.

Using these, or similar equations, the reverse compression tree generator 82 sequentially develops raw data corresponding to the raw data used by the data compression system 60 of FIG. 6 to create the compression tree. The raw data extractor 84 recognizes each raw data point (e.g., the zero level layer of the reconstructed compression tree) and delivers these data points as the decompressed data. If desired, the reverse compression tree generator 82 may remove coefficients from the memory 80 when these coefficients are no longer needed to determine any lower level points in the compression tree being developed.

Of course, any or all of the receiver 78, the reverse compression tree generator 82 and the raw data extractor 84 may be implemented by software stored on a computer readable medium and run on a computer in any desired or known manner. These elements may also be implemented in specialized hardware, firmware, etc. as desired.

In one embodiment, the compression technique of the present invention is implemented in a manner that uses only minimal memory and processing overhead. In this embodiment, a set of stacks is manipulated to build a compression tree and, simultaneously, to maintain the minimal set of approximation coefficients to be used as the compressed data corresponding to a set of received raw data. The use of stack manipulation to build a compression tree (having an associated filter of length of N=4) will be described herein with reference to a series of steps illustrated in FIG. 8 while stack manipulation to regenerate raw data from the compressed data (i.e., to decompress data) developed by the system associated with FIG. 8 will be described herein with reference to the series of steps illustrated in FIG. 9.

Figure 8:
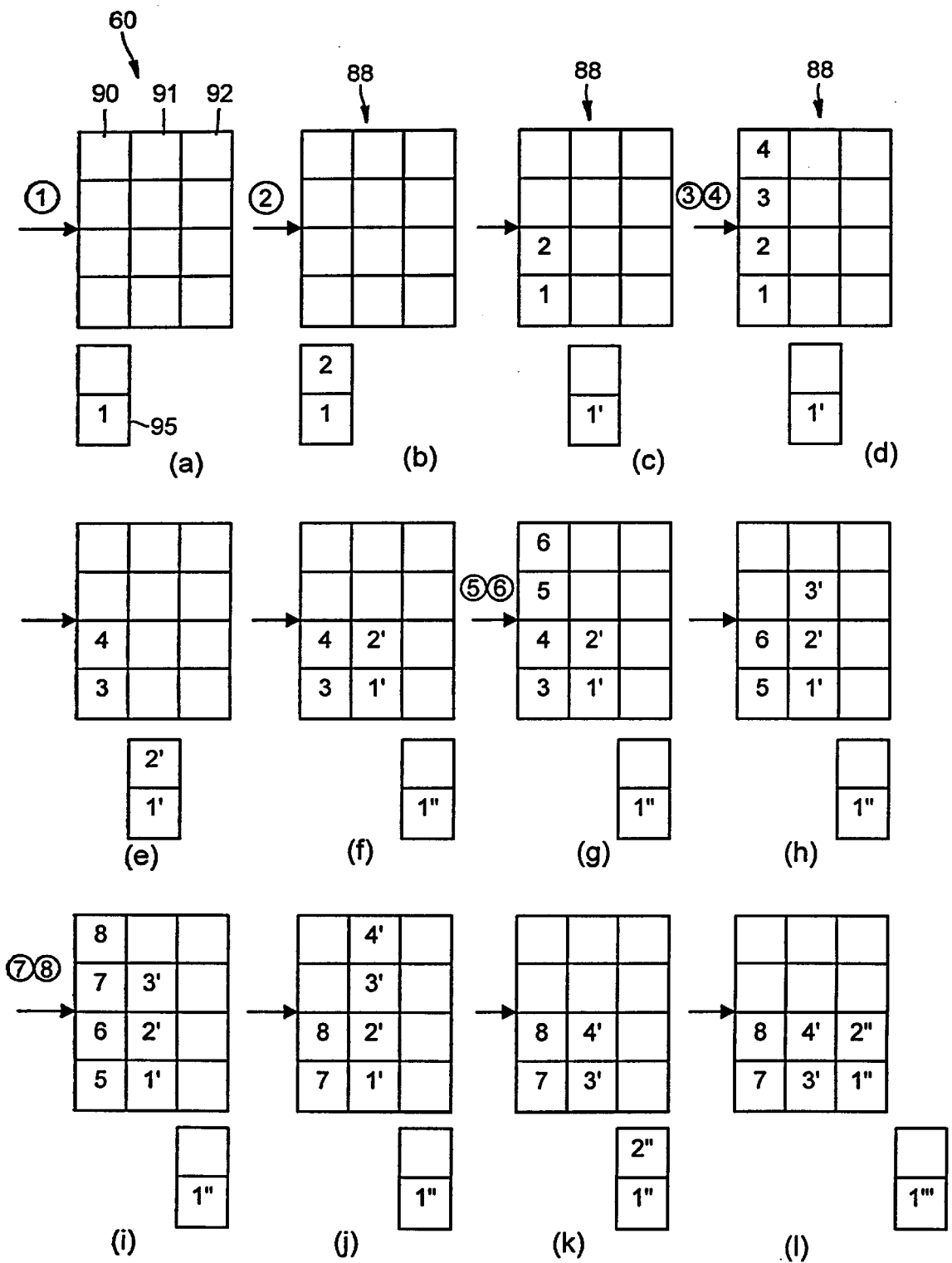
FIG. 8 is a flow diagram illustrating the operation of a stack manipulation procedure implementing the recursive wavelet data compression technique according to the present invention.

Generally speaking, to implement the recursive wavelet data compression technique of the present invention using a series of stacks, the compression system includes a stack having n memory locations associated with each level of a compression tree in addition to a padding stack having n−2 memory locations. Each step illustrated in FIG. 8 shows a memory 88 having a zero level stack 90, a first level stack 91 and a second level stack 92 each having four (because, here, n=4) memory locations. Of course further stacks for higher levels could be added, as desired or necessary. The memory 88 illustrated at each step of FIG. 8 also includes a padding stack 95 having two (i.e., n−2) memory locations therein.

In FIG. 8, raw data, i.e., received data to be compressed, is illustrated as having the time index associated therewith within a circle. Similar to FIG. 5, the approximation coefficients of the compression tree (which are the only coefficients stored in the memory 88) are illustrated as being stored in the stacks 90, 91, 92 and 95 with the numerical time index of the coefficient having a prime indicating the level of the tree with which the coefficient is associated. Thus, 2' is the approximation coefficient for the second time index at the first level of the compression tree. Similarly, 4 is the approximation coefficient (raw data) for the fourth time index at the zero level of the compression tree.

The compression system used of FIG. 8 is configured so that approximation coefficients are entered into the appropriate stack when these coefficients become available or are generated. When any of the stacks 90, 91, 92 or 95 becomes full, which indicates that a higher level approximation (and detail) coefficient can be calculated, the higher level coefficients are determined using, for example, equations (1) an (2), and the approximation coefficient is stored at an appropriate location within the memory 88. The padding stack 95 is used to initially receive and store the approximation coefficients for each level of the compression tree until the first time indexed approximation coefficient for a higher level of the tree is determined, at which time the padding stack 95 pushes it contents onto the appropriate lower level stack and begins to store the approximation coefficients for the higher level of the compression tree. Furthermore, when any higher level approximation coefficient is calculated and stored in the memory 88, the lower level approximation coefficients which are no longer needed to determine any further higher level coefficients are dumped from the bottom of the stack for that level. These operations will be more apparent with the following description.

At a step (a) of FIG. 8, the first raw data point is received and is entered into the padding stack 95. At a step (b), the second raw data point is received and is entered into the padding stack 95, which fills the padding stack 95. Because symmetric padding is used in this example, enough data is available to calculate the first time indexed approximation coefficient for the first level of the tree (1'). At a step (c), the magnitude of the detail coefficient associated with the 1' value approximation coefficient is determined and compared to a threshold to determine if construction of the tree should be halted. If construction of the tree is to continue, the 1' approximation coefficient is calculated and stored in the padding stack 95 which first pushes its contents into the zero level stack 90. (The step of calculating the detail coefficient or other measure for use in determining if the tree should be continued to be constructed will not be mentioned hereinafter, but should be assumed to take place as each approximation coefficient for level one and higher of the tree is determined. For the purpose of this example, it will be assumed that the calculated detail coefficient magnitudes are all less than their respective thresholds until calculation of the 1''' detail coefficient at step (1) of FIG. 8.)

At a step (d), the raw data points 3 and 4 are entered into the zero level stack 90 (because the padding stack 95 is now being used for the first level coefficients). This operation fills the zero level stack 90 meaning that enough data exists to calculate a first level approximation coefficient, here, 2'. At a step (e), the 2' coefficient is calculated and is placed in the padding stack 95 while the 1 and 2 approximation coefficients, which are no longer needed to calculate any higher level coefficients, are dropped from the zero level stack 90. The padding stack 95 is now full, meaning that a level two coefficient can be calculated from the points therein. At a step (f) the first time indexed coefficient for the second level of the tree (1") is calculated (using the values in the padding stack 95). The 1" approximation coefficient is placed in the padding stack 95, which first pushes its contents into the first level stack 91. Because none of the stacks 90, 91, 92 or 95 is full, no higher level coefficients can be calculated without receipt of new data.

At a step (g), the 5 and 6 data points are received and are placed in the zero level stack 90 which fills this stack. At a step (h), the compression system calculates the 3' coefficient and drops the lower two values from the zero level stack 90. At a step (i), the compression system receives the 7 and 8 raw data values and places these values into the zero level stack 90 which again fills this stack. At a step (j), the 4' coefficient is calculated from the coefficients in the zero level stack 90 and is placed into the first level stack 91. The lower two values of the zero level stack 90 are dropped. Because the first order stack is now full, at a step (k), the compression system calculates the next level two coefficient, i.e., 2" and places this coefficient in the padding stack 95. This operation fills the padding stack 95 meaning that the 1'" point can be determined. Here, it is assumed that the magnitude of the detail coefficient for the 1'" point is greater than its associated threshold so that the 1'" approximation coefficient is not calculated or store but, instead, the compression data is developed based on the coefficients in the compression tree after the step (k), i.e., the coefficients in the memory 88 at the step (k). For the sake of completeness, however, the step (l) of FIG. 8 illustrates calculation of the 1'" approximation coefficient assuming construction of the tree is not halted after the step (k). Thus, at step (l), the compression system calculates the first time indexed coefficient of the third level of the compression tree (1'"). This coefficient is placed in the padding stack 95 which first pushes its contents unto the second level stack 92.

As will be understood, the set of minimal coefficients needed to reconstruct the raw data (and which can be used as the compressed data) exists as all of the approximation coefficients stored in the zero, first, second, etc. level stacks 90, 91 and 92 (and the values of the padding stack 95 if the padding stack 95 is full). Thus, after step (k), the set of minimal coefficients needed to reconstruct the raw data points 1–8 are 1", 2", 3', 4', 7 and 8. After step (l), the set of minimal coefficients would be same while, after the step (i), the set of minimal coefficients would be 3', 2', 1', 8, 7, 6 and 5. Generally speaking, the minimal set of coefficients at any particular time is a set of approximation coefficients in the compression tree that, were further approximation coefficients to be added to the compression tree, would be required to directly calculate a higher level coefficient of the compression tree but not to include any coefficients that can be completely calculated from the other coefficients within the set.

While the set of minimal coefficients as described above can be sent or stored as the compressed data, it is also necessary to transmit or store an indication of the size or halting point of the compression tree to enable a decompression unit to properly retrieve and decode the minimal set of coefficients. The reason for this requirement is that the decompression unit does not know the size of the tree beforehand (because the tree size changes from tree to tree) and, therefore, does not know how many or what coefficients are being sent or stored as the compressed data. However, with an indication of the point at which construction of the compression tree was halted, the decompression unit will know both how many compressed data points were developed from the compression tree (i.e., how many data points are associated with any particular tree) and to which approximation coefficients these data points relate, because these variables are uniquely related to the point at which construction of the compression tree is halted. One of the best indications of the size of the tree at any given time is an indication of what approximation coefficient (within the set of minimal approximation coefficients) was last added to the tree before construction of the tree was halted. Thus, for example, after the step (k) of FIG. 8, the last of the minimal coefficients added to the compression tree before the construction of the tree was halted was the 2" coefficient. Therefore, the index of this point, i.e., (2, 2), can be used as the index sent with the minimal coefficients to enable a decompression unit to recover the raw data points 1–8.

Table 1 below provides a listing of the coefficients added to the compression tree, the minimal set of coefficients necessary to recover the raw data and the minimal index associated therewith for compression trees halted after the receipt of between one and eight raw data points. Note that, after the receipt of certain raw data points, such as 2, 4, 6 and 8, there are multiple possible stopping points because more than one coefficient can be added to the compression tree after the receipt of these points.

TABLE 1

| Point Received | Coefficient added tree | Minimal Coefficients | Minimal Index |
| --- | --- | --- | --- |
| 1 | 1 | 1 | (0, 1) |
| 2 | 2 | 1, 2 | (0, 2) |
|   | 1' | 1, 2 | (0, 2) |
| 3 | 3 | 1, 2, 3 | (0, 3) |
| 4 | 4 | 1, 2, 3, 4 | (0, 4) |
|   | 2' | 1', 2', 3, 4 | (1, 2) |
|   | 1" | 1', 2', 3, 4 | (1, 2) |
| 5 | 5 | 1', 2', 3, 4, 5 | (0, 5) |
| 6 | 6 | 1', 2', 3, 4, 5, 6 | (0, 6) |
|   | 3' | 1', 2', 3', 5, 6 | (1, 3) |
| 7 | 7 | 1', 2', 3', 5, 6, 7 | (0, 7) |
| 8 | 8 | 1', 2', 3', 5, 6, 7, 8 | (0, 8) |
|   | 4' | 1', 2', 3', 4', 7, 8 | (1, 4) |
|   | 2" | 1", 2", 3', 4', 7, 8 | (2, 2) |
|   | 1'" | 1", 2", 3', 4', 7, 8 | (2, 2) |

As will be understood, the addition of the 1', 1", 1'" etc. points to the tree does not immediately add these points to the minimal set of coefficients because these points can still be fully determined from the points currently within the minimal set of coefficients. This is an artifact of the use of symmetric padding.

Of course, other types of indexing could be used as well and the invention is not limited to the particular indexing routine or, for that matter, to the particular stack manipulation routine, described herein. Furthermore, as will be understood, the stack manipulation routine and the information in Table 1 could be extended to larger trees, i.e., those constructed from more that eight data points.

Figure 9:
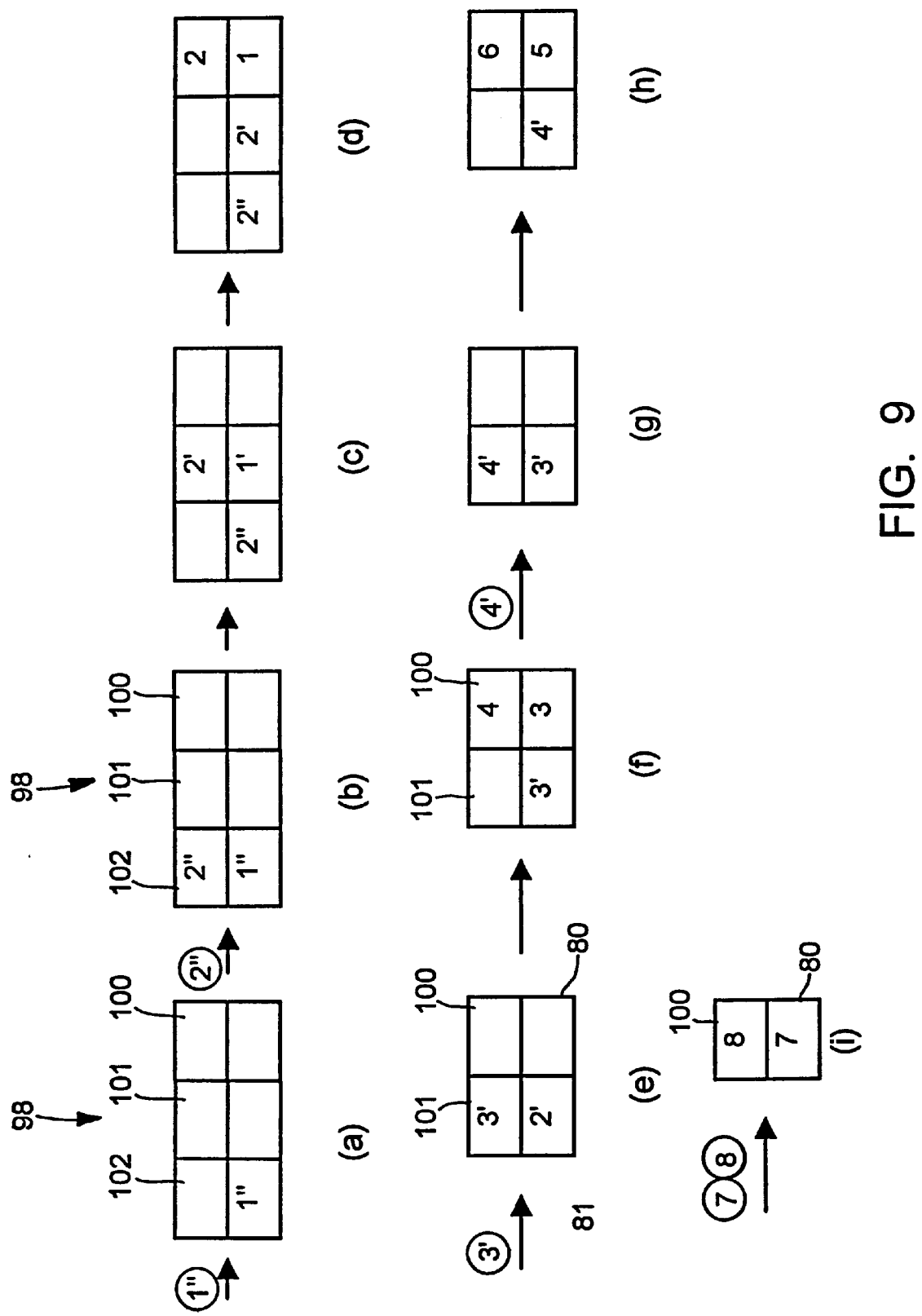
FIG. 9 is a flow diagram illustrating the operation of a stack manipulation procedure for reconstructing data compressed according to the compression technique of the present invention.

Referring now to FIG. 9, a stack configuration for use in a decompression system that reconstructs the raw data points 1–8 from the stored or transmitted compressed data generated in FIG. 8 is illustrated. Similar to the compression system, the decompression system needs to only allocate minimal memory to reconstruct the raw data. This memory may take the form of a stack of n−2 memory locations (wherein n is the filter length associated with wavelet compression technique) for each level of tree (which can be determined by the index sent or stored with the compressed data). Thus, as illustrated in FIG. 9, after receiving the index associated with a compressed tree, the decompression system may allocate a two memory stack for each of the zero, first and second level approximation coefficients. Each of the steps of FIG. 9 illustrates the zero level stack 100 while some of these steps illustrate a first level stack 101 and a second level stack 102.

Initially, the decompression system receives the index for a tree and determines, therefrom, how many and which approximation coefficients are stored or are being transmitted as the compressed data. If desired, the decompression system may store a table similar to that of Table 1 (without the column identifying the coefficients added) but expanded to include trees constructed from more data points and may use this table to interpret the incoming data. Of course, the decompression system may use other types of indexing (such as indices based on how may data points were used to create the tree) and may decode the incoming data in other manners.

Assuming that the decompression unit receives the index (2, 2) generated by the example of FIG. 8, it determines from the Table 1 that it should expect to receive the 1", 2", 3', 4', 7 and 8 approximation coefficients in that order to reproduce eight raw data points. At step (a) of FIG. 9, the decompression system receives and places the 1" coefficient in the second level stack 102. At a step (b), the decompression system receives the 2" coefficient and places this value in the second level stack 102 which fills that stack. As a result, lower level coefficients can be calculated using equations (7) and (8) above. At a step (c), the lower level approximation coefficients 2' and 1' are calculated and are placed in the first level stack 101 which fills this stack. At this time, the lower value of the second level stack 102 is discarded because it is no longer needed to compute any lower level coefficients. Also, because the first level stack 101 is filled, the decompression system, at a step (d), calculates the zero level coefficients 1 and 2 (which are the reconstructed raw data points 1 and 2). The lower value of the first level stack 101 is discarded. Of course, the decompression system uses the data values 1 and 2 as the reconstructed data in any normal manner thereby emptying the zero level stack 100.

At a step (e), the decompression system receives and places the 3' coefficient in the first level stack 101 which fills this stack. At a step (f), the system computes the 3 and 4 zero level approximation coefficients and uses these values as the reconstructed data. Also, the lower value in the first level stack 101 is discarded. At a step (g), the next minimal coefficient (4') is received and is placed in the first level stack 101 thereby filling this stack. A step (h) computes the 5 and 6 approximation coefficients from the values in the first level stack 101, discards the lower value in the first level stack 101 and uses the zero level coefficients as the reconstructed data points 5 and 6. At a step (i), the minimal coefficients 7 and 8 are received, are placed in the zero level stack 100 and are then used as the reconstructed data points 7 and 8. Thereafter, the decompression system may receive the next index and begin to reconstruct data based on the next set of compressed data, which may be associated with a compression tree of a different size.

As will be understood, using the stack configurations illustrated in FIGS. 8 and 9 for compressing and decompressing data requires only a minimal amount of memory while generating compression data or while reconstructing raw data from compressed data. This feature enables the compression and decompression systems (such as the systems 25 of FIG. 1) to be small and inexpensive and relatively easy to incorporate into devices, such as field devices, attached to a bus. Furthermore, the processing is completed as the raw data or the compressed data is received, which evens out the data processing requirements in time and allows a slower and, therefore, less expensive processor to be used in the compression and decompression systems.

Of course, while one embodiment of the present invention has been described as using stack operations to reduce the amount of memory needed to compress and decompress data, other types of computer software and systems could be designed and/or programmed to calculate or determine the compression tree in a recursive, on-line manner according to the principles described herein.

As noted above, instead of comparing each detail coefficient magnitude to a different threshold determined, for example, for each level of the compression tree, the recursive wavelet data compression routine could calculate one or more statistical error values associated with any given point of the compression tree and compare these statistical values to a threshold to determine if construction of the compression tree should be halted. This method has the advantage of being more user friendly in that a user only has to specify one threshold value for each statistical error measurement, and this same threshold will be applied at each point in the tree. Furthermore, in a typical case, a user will feel more comfortable setting the value of the threshold based on an appropriate statistical error measurement, such as the root mean squared error or the local point error, than trying to determine an appropriate threshold for each level of the compression tree, which requires more knowledge and understanding of the mechanics of wavelet data compression.

Generally speaking, the thresholding technique described herein will be based on two statistical error measurements, the root mean squared error (RMSE) and the local point error (LPE) and, when either of these measurements become greater than a specified threshold, construction of the tree will be halted. It will be understood, however, that any other number and type of error measurements could be to perform thresholding.

As is known, given a raw signal $x=(x_0, x_1, \ldots, x_{N-1})$ and a reconstructed signal $x^1=(x^1_0 x^1_1, \ldots, x^1 x_{N-1})$, the root mean squared error $e^R$ is defined as:

$$e^R = \sqrt{\frac{\sum_{i=0}^{N-1}(x_i - x_i^1)^2}{N}} \quad (9)$$

and the local point error $e^L$ is defined as:

$$e^L = \max_{i=0\ldots N-1} |x_i - x_i^1| \quad (10)$$

wherein: N=the number of raw points used to calculate the error measurements; and

|x|=absolute value of x.

For simplicity of processing, instead of calculating the root mean squared error over at each point, the sum squared error $e^S$ may be computed recursively and the root mean squared error can then be computed from sum squared error $e^S$. As is known, the sum square error $e^S$ is defined as:

$$e^S = \sum_{i=0}^{N-1}(x_i - x_i^1)^2 = N(e^R)^2 \quad (11)$$

The recursive relations for $e^S$ and $e^L$ at levels j and j−1 of a wavelet compression tree may be generically modeled as:

$$e_{j+1,k}{}^S = f^S(e_{j,2k}{}^S, e_{j,2k+1}{}^S, a_{j,2k}, a_{j,2k+1}) \quad (12)$$

$$e_{j+1,k}{}^L = f^L(e_{j,2k}{}^L, e_{j,2k+1}{}^L, a_{j,2k}, a_{j,2k+1}) \quad (13)$$

wherein: $a_{j,k}$=the approximation coefficient for the jth level and the kth time point of the compression tree; and $f$=denotes a function.

The specific recursive relation for sum squared error $e^S$ at a point in a HAAR wavelet compression tree is given by:

$$e_{j+1,k}^S = e_{j,2k}^S + e_{j,2k+1}^S + \left(\frac{a_{j,2k} - a_{j,2k+1}}{\sqrt{2}}\right)^2 \quad (14)$$

while the recursive relation for local point error $e^L$ at a point in a wavelet compression tree is given in terms of the positive local point error $e^{L+}$ and the negative local point error $e^{L-}$ as follows:

$$e_{j,k}^L = \max[e_{j,k}^{L+}, e_{j,k}^{L-}] \quad (15)$$

The positive local point error and the negative local point error are defined as the maximum local point error in the positive direction and negative direction, respectively. The expressions for $e^{L+}$ and $e^{L-}$ are given by:

$$e_{j+1,k}^{L+} = \max[e_{j,2k}^{L+} + \beta(j,k), e_{j,2k+1}^{L+} - \beta(j,k)] \quad (16)$$

$$e_{j+1,k}^{L-} = \max[e_{j,2k}^{L-} - \beta(j,k), e_{j,2k+1}^{L-} + \beta(j,k)] \quad (17)$$

wherein $\beta$ is a value proportional to the detail coefficient of a point in a compression tree at the level j and the time k and may be determined as:

$$\beta(j,k) = \frac{1}{2^{j/2}} \left|\frac{a_{j,2k} - a_{j,2k+1}}{2}\right| \quad (18)$$

As mentioned above, the cumulative local point error and the cumulative sum squared error (and therefore the cumulative root mean squared error) can be computed at any point where two branches of the compression tree are combined (i.e., at a higher level) as the compression tree is grown, using the following equations:

$$\bar{e}_T^S = e_T^S + e_{j+1,k}^S - (e_{j,2k}^S + e_{j,2k+1}^S) \quad (19)$$

wherein: $e^S_T$=the current total (cumulative) sum squared error;

$\bar{e}^S_T$=the new total (cumulative) sum squared error at the newly calculated point; and $e^S_{j,k}$=the sum squared error associated with the point at level j and time value k.

Likewise, the cumulative local point error at any point where two branches trees are combined (i.e., at a higher level) can be expressed as:

$$\bar{e}_T^L = \max(e_T^L, e_{j+1,k}^L) \quad (20)$$

wherein: $e^L_T$=the current total (cumulative) local point error;

$\bar{e}^L_T$=the new total (cumulative) local point error at the newly calculated point; and $e^L_{j,k}$=the local point error associated with the point at level j and time value k.

Of course, the cumulative root mean squared error can be computed as:

$$\bar{e}_T^R = \sqrt{\frac{\bar{e}_T^S}{n}} \quad (21)$$

wherein: $\bar{e}^R_T$=the new total (cumulative) root mean squared error; and

N=the number of raw data points that have arrived since construction of the tree started.

In essence, the compression routine using statistical error measurements to perform thresholding computes the $e^S$ and the $e^L$ values at each point using the recursive expressions (14) and (15) given above, computes the cumulative sum squared error $\bar{e}^S$ and the cumulative local point error $\bar{e}^L$ using equations (19) and (20), computes the cumulative root mean squared error value $\bar{e}^R$ using equation (21) and compares the cumulative root mean squared error value $\bar{e}^R$ and the cumulative local point error value $\bar{e}^L$ value to the thresholds $\theta^R$ (for the root mean squared error) and the $\theta^L$ (for the local point error). If one or both the of the thresholds $\theta^R$ or $\theta^L$ is less than the computed $\bar{e}^R$ and the $\bar{e}^L$ values, respectively, construction of the compression tree is halted without adding the new point to the compression tree.

The following section provides a step by step description of a routine that uses the adaptive thresholding described above in the recursive wavelet data compression routine of the present invention. In this description:

| | | |
|---|---|---|
| j | = | the level of the compression tree. |
| k(j) | = | the time index for level j that is to be filled next. |
| C | = | a set of minimal coefficients. |
| (B(r), B(t)): | = | a pair of book keeping indexes of the form (j, k(j)). |
| $\theta^R$ | = | the maximum allowed root mean squared error. |
| $\theta^L$ | = | the maximum allowed local point error. |
| $e^S_T$ | = | the total accumulated sum squared error. |
| $e^L_T$ | = | the total accumulated local point error. |
| $e^S_{j,k}$ | = | the sum squared error of the tree rooted at node $a_{j,k}$ |
| $e^L_{j,k}$ | = | the local point error of the tree rooted at node $a_{j,k}$ |
| $E^S$ | = | a set containing the sum squared error terms $e^S_{j,k}$ |
| $E^L$ | = | a set containing the local point error terms $e^L_{j,k}$ |

Step 1: Initialize values:

| | | |
|---|---|---|
| k(j) | = | 0 for all j = 0, 1 . . . , J-1, J |
| C | = | { }, i.e., the null set |
| (B(r), B(t)) | = | (-1, -1) (i.e., any invalid values) |
| $E^S$ | = | { } |
| $E^L$ | = | { } |

Step 2: Receive next point $a_{j,k(j)}$ and (a) update set C and B as follows:

$$C = C + \{a_{0,k(0)}\} \quad (22)$$

$$(B(r), B(t)) = (0, k(0)) \quad (23)$$

(b) update $E^S$ and $E^L$ $$E^S = E^S + \{e_{S0,k(0)}\} \quad (24)$$

$$E^L = E^L + \{e^L_{0,k(0)}\} \quad (25)$$

Step 3: Update tree as much as possible starting from level j=1. Thus, while k(j)−1 is divisible by 2, do the following:

(a) Compute the approximation coefficient $a_{j,k(j)}$, using:

$$a_{j,k(j)} = \frac{1}{\sqrt{2}}(a_{j-1,2k(j)} - a_{j-1,2k(j)+1}) \quad (26)$$

$$= \frac{1}{\sqrt{2}}(a_{j-1,k(j-1)-1} - a_{j,k(j-1)-2})$$

(b) Compute the error estimates $e^S_{j,k(j)}$ and $e^L_{j,k(j)}$ using equations (14) and (15);

(c) Compute the estimated total root mean squared error $\bar{e}^R_T$ and the total local point error $\bar{e}^L_T$ and if the tree is grown at this point using equations (19), (20) and (21);

(d) If $\bar{e}^R_T$ is less than $\theta^R$ and $\bar{e}^L_T$ is less than $\theta^L$ then grow the tree by performing the steps of:
  (1) Update sets C and B as follows:

$$C = C + \{a_{j,k(j)}\} - \{a_{j-1,2k(j)}, a_{j-1,2k(j)+1}\} \quad (27)$$

$$(B(r), B(t)) = (j, k(j)) \quad (28)$$

(2) Update sets $E^S$ and $E^L$ as follows:

$$E^S = E^S + \{e^S_{j,k(j)}\} - \{e^S_{j-1,2k(j)}, e^S_{j-1,2k(j)+1}\} \quad (29)$$

$$E^L = E^L + \{e^L_{j,k(j)}\} - \{e^L_{j-1,2K(j)}, e^L_{j-1,2k(j)+1}\} \quad (30)$$

(3) Update total accumulated error $e^S_T$ and $e^L_T$
  (4) Set k(j)=k(j)+1 (increment index at level j)
  (5) Set j=j+1 (move on to next lower resolution)
(e) Otherwise
  (1) Send the sets C and B as the compressed data; and
  (2) go to step 1 (start new tree)
Step 4: k(0)=k(0)+1 and go to Step 2.

The compression technique described herein is particularly useful in certain systems which use, for example, Intel's new video processor chips which are capable of performing video compression techniques and of manipulating compressed video data. Generally, the wavelet compression technique described herein would be applied at the points in a process control system (or other communication system) where measurements are initially taken, such as at a controller or at a field device, to compress the incoming data. The controllers, multiplexers and other measurement devices distributed throughout the system would send the compressed data directly to interface stations and data historians capable of archiving the compressed data. The interface stations could use the video processing routines already on the, for example, Intel chip to display the short-term or long-term trends, to decompress the data for display, or to perform any other function provided by software on the chip. Furthermore, data historians could be designed to use the compressed data directly, without having to decompress the data first. Furthermore, in certain instances, such as in displaying wavelet scaling factor and amplitude versus time information, the compressed wavelet data can be used directly for process analysis without decompressing the data.

It will also be understood that the wavelet data compression technique described herein may be applied to any wavelet basis of any length and has the advantages of minimizing the memory requirements necessary to implement compression in, for example, a controller, minimizing processor loading at any given time and minimizing the bandwidth needed to communicate compressed data. Of course, the compression technique described herein is not limited to the use of HAAR wavelet filters but can be applied to other types of known wavelet filters or filters developed in the future. Still further, while a wavelet data compression technique has been described herein in conjunction with a process control system, this technique may be used in any communication system, such as any video, audio and/or data communication system used for any application.

It should be noted that, while the above adaptive thresholding routine has been described herein as particularly useful in wavelet data compression techniques, this adaptive thresholding routine may be used in other on-line processing applications that typically use hard or soft thresholding techniques and, in fact, can be used in any on-line process that requires thresholding. As examples, the adaptive thresholding routine described herein may be used in other on-line data compression techniques such as in the Boxcar, Backward Slope, etc. interpolative techniques as well as in on-line uni-variate and multi-variate data compression, image compression, video compression, speech (audio) compression techniques and application based data compression techniques, such as those used in scanners, fax machines, printers, web based multi-media applications, etc. Furthermore, the adaptive thresholding technique described herein may be used in noise removal, sensor validation, fault detection, multi-variate fault detection, process identification, system identification and pattern recognition applications, as well as any other statistical processing or data processing applications that use thresholding.

Figure 10:
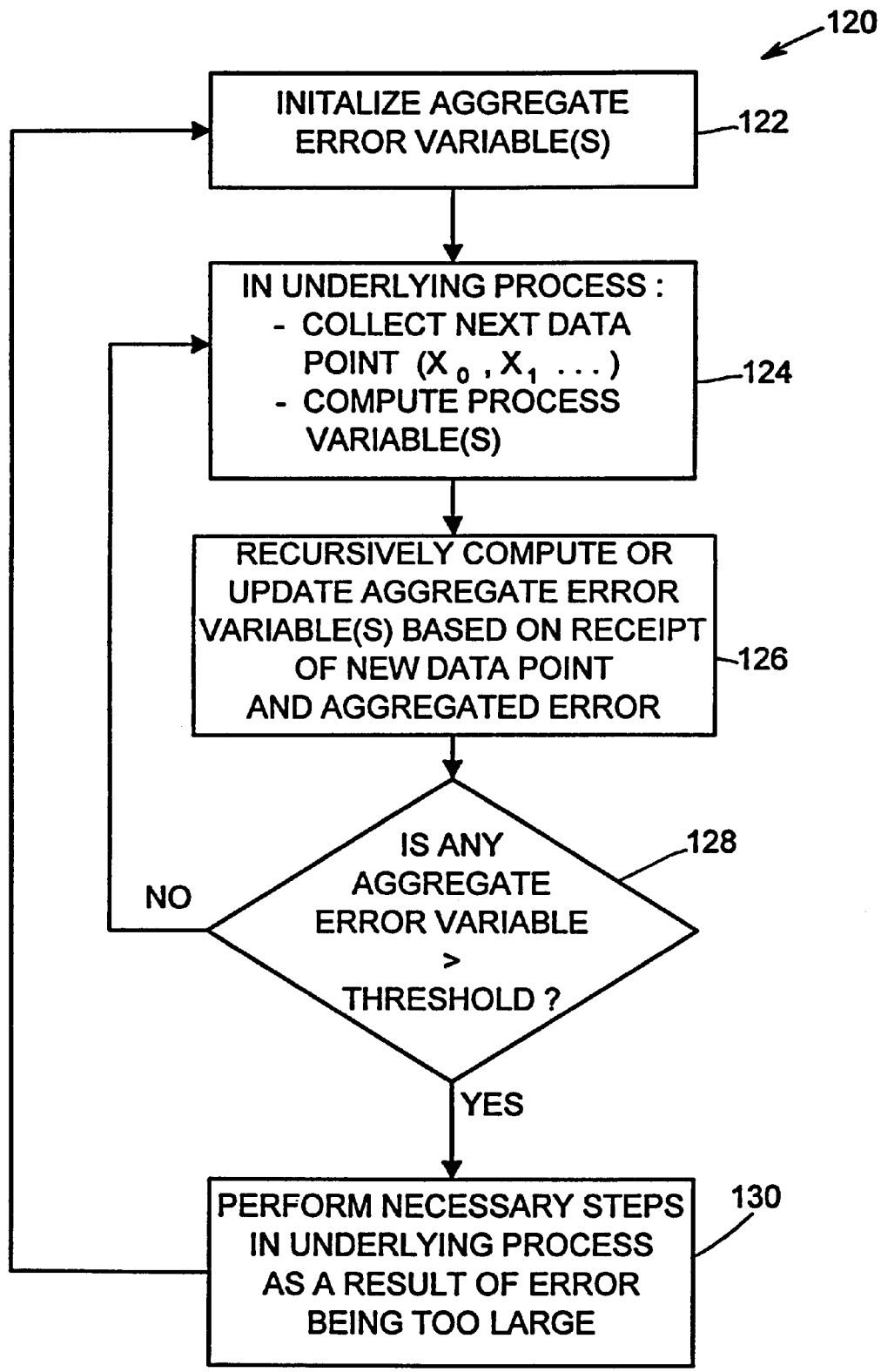
FIG. 10 is a flow diagram illustrating a thresholding routine according to the present invention.

The flowchart 120 of FIG. 10 is useful in illustrating the manner in which the adaptive thresholding technique described herein can be implemented in other processing techniques. Generally speaking, the routine illustrated by flowchart 120 will be implemented inside of, or as part of an underlying processing routine that receives data in a sequential manner, i.e., as a series of sequential data points. In the past, these routines calculated a threshold based on the difference between two received data points (typically the last received data point and an initial data point) and then compared that error value to some preset threshold. The flowchart 120, on the other hand, determines on-line one or more aggregate error variables based on all of the received data points, or a least on a sequential subset of three or more of the received data points, and then compares these one or more aggregate error variables to thresholds. As described above, the use of an aggregate error thresholding technique produces more accurate results and allows a user to select an appropriate threshold without needing to understand all of the complexities of the underlying process computations.

Referring now to FIG. 10, the routine, which may be stored on any computer readable medium such as a disk, hard drive, etc., and which is implementable on a computer device includes, a block 122 that initializes the one or more aggregate error variables, typically by setting them to zero. Within a block 124, the underlying processing routine, which may be, for example, any of the above-identified routines, performs the steps of collecting or receiving a data point $(X_0, X_1, \ldots)$ and making any necessary calculations based on the receipt of this data point. Of course the calculations or steps performed by the underlying processing routine in the block 124 will depend on the type of routine being implemented and are not important to the error thresholding technique described herein, other than the fact that one or more process variables computed by the underlying processing routine will be used to determine the aggregate error variable(s). The particular process variables used for aggregate error computation will, of course, depend on the underlying process and will be readily known by those skilled in the art of the particular underlying process being implemented.

Next, a block 126 computes or updates the aggregate error variable(s) from the data point received and/or the process variables determined by the block 124. In a preferred embodiment, the aggregate error variables are the cumulative local point error and the cumulative root mean squared error, the calculation of both of which will be understood by those skilled in the art of the underlying processes. Generally speaking, however, these variables can be determined using equations similar to equations (9) and (10) to determine the local point error and the root mean squared error after the receipt of any particular data point and then using equations similar to equations (20) and (21) given above. Of course, the cumulative root-mean squared error may be determined recursively using the sum squared error as described above. While the flowchart 120 is described as using both the cumulative local point error and the cumulative root mean squared error, the adaptive thresholding technique described herein may use only one of these errors or may use any other one or more aggregate error variables (i.e., those determined from a sequence of three or more sequential data points) instead or in addition thereto.

When the aggregate error variable(s) are calculated, a block 128 compares these values to the values of corresponding preset thresholds. If each of the aggregate error variables is less than the corresponding threshold, the routine returns to the block 124 for the receipt of the next data value. The steps of receiving a data point, updating one or more aggregate error values based on the data point and comparing the one or more aggregate error values to preset thresholds are repeated until one of the aggregate error variables is greater than the corresponding preset threshold. At this point, a block 130 takes whatever steps are usually performed in previous soft or hard thresholding implementations of the underlying process when the threshold is exceeded. For example, in a data compression routine, the data point is stored as one of the necessary compression data points. In other routines, other values may be stored or steps may be taken, depending on the underlying processing routine being implemented. Thereafter, control returns to the block 122 which resets the aggregate error values and the thresholding process begins again on the next subset of sequential data.

While the present invention has been described with reference to specific examples, which are intended to be illustrative only, and not to be limiting of the invention, it will be apparent to those of ordinary skill in the art that changes, additions and/or deletions may be made to the disclosed embodiments without departing from the spirit and scope of the invention.

What is claimed is:

1. A data compression system that compresses a stream of data points, comprising:
    a data receiver that receives the data points in a sequential manner;
    a compression tree computation device that determines a compression tree from the received data points, wherein the determined compression tree includes coefficients in a zero level layer that are equal to the stream of data points and coefficients in one or more higher level layers determined from the coefficients in the zero level layer;
    a memory that stores the determined coefficients of the compression tree; and
    a compression data generator that selects a subset of the determined coefficients to create a set of compressed data corresponding to the received data points;
    wherein the compression tree computation device determines one of the coefficients of one of the higher level layers after the data receiver receives a first one of the data points but before the data receiver receives a second one of the data points.

2. The data compression system of claim 1, wherein the compression tree computation device includes a compression tree coefficient calculator that calculates all of the coefficients of the higher level layers of the compression tree that can be calculated from the stored coefficients of the compression tree after receipt of each one of the data points.

3. The data compression system of claim 1, further including a data remover that removes each coefficient from the memory when that coefficient is no longer required to directly calculate any coefficient in a higher level layer of the compression tree.

4. The data compression system of claim 1, wherein the memory comprises a stack memory.

5. The data compression system of claim 4, wherein the compression tree computation device calculates the compression tree using a filter of length N and the stack memory includes a separate stack, having N memory locations, associated with each of the levels of the compression tree.

6. The data compression system of claim 5, wherein the memory further includes a padding stack.

7. The data compression system of claim 6, wherein the padding stack includes N−2 memory locations.

8. The data compression system of claim 1, wherein the compression tree computation device includes a padding data point generator that generates padding data points associated with a particular level of the compression tree for use in calculating initial coefficients of a level of the compression tree that is higher than the particular level.

9. The data compression system of claim 8, wherein the padding data point generator sets the padding data points for the particular level symmetrically equal to initial coefficients of the particular level.

10. The data compression system of claim 1, wherein the compression data generator selects the compressed data to include a set having all of the compression tree coefficients in the compression tree that, were further coefficients to be added to the compression tree, would be required to directly calculate a higher level coefficient of the compression tree but not to include any coefficients that can be completely calculated from the other coefficients within the set.

11. The data compression system of claim 10, wherein the compression data generator further includes an index generator that generates an index specifying which coefficients were selected by the compression data generator as the compressed data.

12. The data compression system of claim 11, wherein the index generator generates an index that corresponds to the location in the compression tree of the coefficient, selected by the compression data generator as part of the compressed data, that was last determined by the compression tree computation device.

13. The data compression system of claim 1, further including a comparator that compares the determined coefficients with a threshold and wherein the compression data generator selects the compressed data when the comparator determines that one of the determined coefficients is greater than the threshold.

14. The data compression system of claim 13, wherein the comparator stores a predetermined threshold for each layer of the compression tree greater than the zero level layer and compares the coefficients for a particular level of the compression tree to the stored threshold associated with the particular level.

15. The data compression system of claim 13, wherein the compression tree computation device computes a first and a second coefficient for each of a number of points of the compression tree at levels greater than the zero level layer and wherein the memory stores the first coefficient for each of the number of points therein and the comparator compares the second coefficient for each of the number of points to the threshold.

16. The data compression system of claim 15 wherein the first coefficient is a wavelet approximation coefficient and the second coefficient is a wavelet detail coefficient.

17. The data compression system of claim 1, further including a comparator that compares an error measurement with a threshold and wherein the compression data generator selects the compressed data when the comparator determines that the error measurement is greater than the threshold.

18. The data compression system of claim 17, wherein the error measurement is a local point error measurement.

19. The data compression system of claim 17, wherein the error measurement is a root mean squared error measurement.

20. The data compression system of claim 1, further including a data decompression device including a receiver that receives the compressed data, a memory that stores the received compressed data and a reverse compression tree generator that calculates points in the compression tree from the stored compressed data as each of the compressed data is received to thereby recover an approximation of the stream of data points.

21. A data compression system of claim 1, wherein the compression tree computation device determines a series of compression trees of different sizes from the received data points.

* * * * *